(12) United States Patent
Yokoyama et al.

(10) Patent No.: US 12,027,402 B2
(45) Date of Patent: Jul. 2, 2024

(54) SUBSTRATE PROCESSING APPARATUS AND SUBSTRATE PROCESSING METHOD

(71) Applicant: EBARA CORPORATION, Tokyo (JP)

(72) Inventors: Toshio Yokoyama, Tokyo (JP); Tomonori Hirao, Tokyo (JP); Takuya Tsushima, Tokyo (JP); Hirotaka Ohashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 756 days.

(21) Appl. No.: 17/140,780

(22) Filed: Jan. 4, 2021

(65) Prior Publication Data

US 2021/0210368 A1    Jul. 8, 2021

(30) Foreign Application Priority Data

Jan. 6, 2020    (JP) .................................. 2020-000384

(51) Int. Cl.
*G05B 15/02* (2006.01)
*B25J 9/16* (2006.01)
*H01L 21/67* (2006.01)
*H01L 21/677* (2006.01)
*H01L 21/68* (2006.01)

(52) U.S. Cl.
CPC .......... *H01L 21/681* (2013.01); *B25J 9/1697* (2013.01); *G05B 15/02* (2013.01); *H01L 21/67259* (2013.01); *H01L 21/67748* (2013.01); *H01L 21/68* (2013.01); *G05B 2219/37555* (2013.01)

(58) Field of Classification Search
CPC .............. B25J 9/1697; H01L 21/67259; H01L 21/67294; H01L 21/67748; H01L 21/68; H01L 21/681; G05B 15/02; G05B 2219/37555

See application file for complete search history.

(56) References Cited

U.S. PATENT DOCUMENTS

2008/0013089 A1\* 1/2008 Ishii ...................... G03F 9/7011
356/400
2015/0017745 A1  1/2015 Kimba et al.
(Continued)

FOREIGN PATENT DOCUMENTS

JP    H11-284052 A    10/1999
JP    2009-027202 A    2/2009
(Continued)

*Primary Examiner* — Yuhui R Pan
(74) *Attorney, Agent, or Firm* — BakerHostetler

(57) ABSTRACT

An adjusting system is controlled such that an arrangement of the substrate is adjusted based on detection by a first sensor, and a second sensor is controlled to detect a characteristic point formed in advance on a plate surface of the substrate, wherein the arrangement of the substrate has been adjusted based on the detection by the first sensor. Moreover, it is checked whether a position of the characteristic point detected by the second sensor is within an allowable range, and the adjusting system is controlled to adjust the arrangement of the substrate based on the detection by the second sensor when the position of the characteristic point detected by the second sensor is within the allowable range, and the attaching/detaching system is controlled to attach the substrate to the substrate holder after the arrangement of the substrate is adjusted based on the detection by the second sensor.

11 Claims, 14 Drawing Sheets

(56) References Cited

U.S. PATENT DOCUMENTS

| | | | |
|---|---|---|---|
| 2018/0286730 A1 | 10/2018 | Yamakawa et al. | |
| 2019/0181026 A1 | 6/2019 | Yamakawa et al. | |
| 2019/0189480 A1* | 6/2019 | Yamasaki | .............. C25D 21/12 |

FOREIGN PATENT DOCUMENTS

| | | | |
|---|---|---|---|
| JP | 2015-035595 A | 2/2015 | |
| JP | 2018-168432 A | 11/2018 | |
| JP | 2019-106479 A | 6/2019 | |
| JP | 2019-110200 A | 7/2019 | |

* cited by examiner

SUBSTRATE PROCESSING APPARATUS AND SUBSTRATE PROCESSING METHOD

TECHNICAL FIELD

The present invention relates to a substrate processing apparatus and a substrate processing method.

BACKGROUND ART

Conventionally, as one example of substrate processing apparatus, a plating apparatus which applies plating process to a substrate has been known. Generally, in such plating apparatus, the substrate formed in advance with a pattern such as a hole or a mask is inserted in the plating apparatus. Moreover, in the plating apparatus, the substrate is attached to a substrate holder through transportation by a transporter, and plating process is applied to the substrate in a state of being attached to the substrate holder. At this time, the transporter which transfers the substrate is not necessarily able to transfer the substrate while holding the substrate constantly at the same position and with the same angle. Consequently, when the substrate is attached to the substrate holder, the substrate may be shifted from a predetermined correct position. Such misalignment of the substrate to the substrate holder may damage the substrate or prevent correct processing to the substrate.

In order to address such problem, a substrate processing apparatus in which, when a substrate is transferred to a predetermined position, positions of two corners of the substrate are detected by an image sensor to determine a position of the substrate has been proposed (for example, see Japanese Patent Laid-Open No. 2018-168432 (PTL 1)). In this substrate processing apparatus, the substrate is illuminated from an opposite side from the image sensor by an illuminator, so that the corners of the substrate can be detected with high accuracy.

CITATION LIST

Patent Literature

PTL 1: Japanese Patent Laid-Open No. 2018-168432

SUMMARY OF INVENTION

Technical Problem

In a method disclosed in Japanese Patent Laid-Open No. 2018-168432, the position and an angle of the substrate are corrected by detecting the positions of the two corners of the substrate by the image sensor. However, there has been a case where the position and the angle of the substrate cannot be corrected with a sufficient accuracy when the substrate is significantly warped, etc. Also, there has been a case where the positions of the two corners of the substrate cannot be detected since a light may penetrate through the substrate depending on a material of the substrate.

An object of the present invention, which has been made in consideration of such circumstances, is to propose a substrate processing apparatus and a substrate processing method which achieves positioning of the substrate to the substrate holder with high accuracy and achieves holding.

Solution to Problem

According to one embodiment of the present invention, there is proposed a substrate processing apparatus including: a substrate holder which holds a substrate; an attaching/detaching system which attaches the substrate to the substrate holder; a first sensor which detects an arrangement of the substrate based on an outer shape of the substrate; a second sensor which detects a characteristic point formed in advance on a plate surface of the substrate; an adjusting system configured to adjust the arrangement of the substrate; and a controller, wherein the controller controls the adjusting system to adjust the arrangement of the substrate based on detection by the first sensor, the controller controls the second sensor to detect the characteristic point formed in advance on the plate surface of the substrate, wherein the arrangement of the substrate has been adjusted based on the detection by the first sensor, the controller checks whether a position of the characteristic point detected by the second sensor is within an allowable range, the controller controls the adjusting system to adjust the arrangement of the substrate based on detection by the second sensor when the position of the characteristic point detected by the second sensor is within the allowable range, and the controller controls the attaching/detaching system to attach the substrate to the substrate holder after the arrangement of the substrate is adjusted based on the detection by the second sensor.

According to another embodiment of the present invention, there is proposed a substrate processing method in a substrate processing apparatus including a substrate holder which holds a substrate, an attaching/detaching system which attaches the substrate to the substrate holder, and an adjusting system configured to adjust an arrangement of the substrate, the method including: a first detecting step of detecting the arrangement of the substrate based on an outer shape of the substrate; a first adjusting step of controlling the adjusting system to adjust the arrangement of the substrate based on detection in the first detecting step; a second detecting step of detecting a characteristic point formed in advance on a plate surface of the substrate, wherein the arrangement of the substrate has been adjusted in the first adjusting step; a second adjusting step of controlling the adjusting system to adjust the arrangement of the substrate based on detection in the second detecting step when a position of the characteristic point detected in the second detecting step is within an allowable range after checking whether the position of the characteristic point detected is within the allowable range; and an attaching step of controlling the attaching/detaching system to attach the substrate to the substrate holder after the second adjusting step.

DESCRIPTION OF EMBODIMENTS

Figure 1:
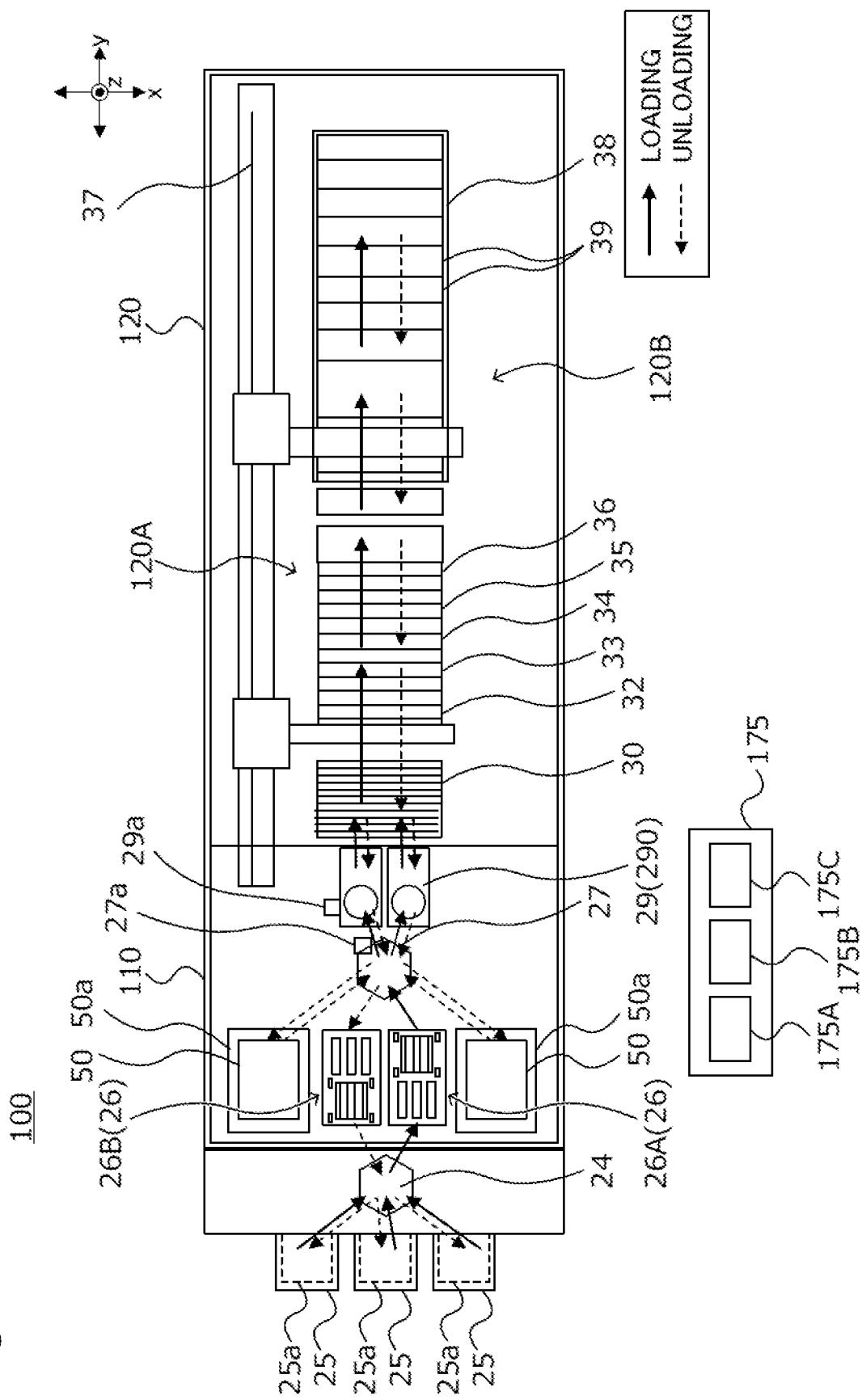
FIG. 1 is an entire arrangement drawing of a substrate processing apparatus according to one embodiment of the present invention.

Hereinafter, an embodiment of the present invention will be explained with reference to the drawings. Additionally, the drawings used are schematic drawings. Consequently, the size, position and shape etc. of illustrated parts can be different from those of an actual apparatus. Also, in the following explanation and the drawings used in the following explanation, components having the same configuration are applied the same reference numerals, and a duplicate explanation will be omitted.

First Embodiment

FIG. 1 is an entire arrangement drawing of a substrate processing apparatus 100 according to one embodiment of the present invention. In this example, the substrate processing apparatus 100 is an electrolytic plating apparatus. While an explanation will be made here taking the electrolytic plating apparatus as an example, the present invention can be applied for other substrate processing apparatuses such as an arbitrary plating apparatus, a polishing apparatus, a grinding attachment, a coating equipment and an etching equipment.

The substrate processing apparatus 100 is broadly divided into a load/unload station 110 which loads a substrate (work) on a substrate holder 11 (not shown in FIG. 1) or unloads the substrate from the substrate holder 11, a processor 120 which processes a substrate S and a cleaner 50a. The processor 120 further includes a pre-processor/post-processor 120A which performs pre-processing and post-processing of the substrate and a plating processor 120B which performs plating processing to the substrate. Additionally, the substrate S includes a rectangular substrate and a circular substrate. Also, the rectangular substrate includes a polygonal glass substrate such as a rectangle, a liquid crystal substrate, a printed substrate, and other polygonal works. The circular substrate includes a semiconductor wafer, a glass substrate and other circular works.

The load/unload station 110 includes an adjusting system 26, a substrate transporter 27 and an attaching/detaching system 29. As one example, in this embodiment, the load/unload station 110 includes two adjusting systems 26 which are an adjusting system for loading 26A which handles the substrate S before processing and an adjusting system for unloading 26B which handles the substrate S after processing. In this embodiment, the adjusting system for loading 26A and the adjusting system for unloading 26B have the same configuration and differ in orientation by 180° in an arrangement. Additionally, the adjusting systems 26 are not limited to provision of the adjusting system for loading 26A and the adjusting system for unloading 26B, and may be used without distinction between for loading and for unloading. Also, in this embodiment, the load/unload station 110 includes two attaching/detaching systems 29. The two attaching/detaching systems 29 are the same system, and vacant one (one does not handle the substrate S) is used. Additionally, one, or three or more adjusting systems 26 and one, or three or more attaching/detaching systems 29 may be provided in accordance with a space in the substrate processing apparatus 100.

In the adjusting system 26 (the adjusting system for loading 26A), the substrate S is transferred from a plurality of (three in FIG. 1 as one example) cassette tables 25 through a robot 24. Each cassette table 25 includes a cassette 25a which houses the substrate S. The cassette is a hoop, for example. The adjusting system 26 is configured to adjust (alignment) the position and the orientation of the substrate S mounted. An attaching/detaching module 290 is arranged at the attaching/detaching system 29 and configured to attach/detach the substrate S to/from the substrate holder 11. The attaching/detaching system 29 includes a control device 29a. The control device 29a communicates with a controller 175 of the substrate processing apparatus 100 to control an operation of the attaching/detaching system 29. Between the adjusting system 26 and the attaching/detaching system 29, a substrate transporter 27 including a transfer robot (substrate transport equipment) 270 which transfers the substrate between these units is disposed. The substrate transporter 27 includes a controller 27a. The controller 27a communicates with the controller 175 of the substrate processing apparatus 100 to control an operation of the substrate transporter 27.

The cleaner 50a includes a cleaning module 50 which cleans the substrate after plating processing for drying. The substrate transporter 27 is configured to transfer the substrate after plating processing to the cleaning module 50 and take out the cleaned substrate from the cleaning module 50. Moreover, the cleaned substrate is transferred to the adjusting system 26 (the adjusting system for unloading 26B) by the substrate transporter 27 and returned to the cassette 25a through the robot 24.

The pre-processor/post-processor 120A includes a pre-wet module 32, a pre-soak module 33, a pre-rinse module 34, a blow module 35 and a rinse module 36. In the pre-wet module 32, the substrate is soaked in pure water. In the pre-soak module 33, an oxide film on a surface of a conductive layer, including a seed layer, which is formed on a surface of the substrate is removed by etching. In the pre-rinse module 34, the substrate after pre-soaking is cleaned together with the substrate holder by cleaning liquid (pure water etc.). In the blow module 35, liquid draining of the substrate after cleaning is performed. In the rinse module 36, the substrate after plating is cleaned together with the substrate holder by the cleaning liquid. Additionally, the configuration of the pre-processor/post-processor 120A of the substrate processing apparatus 100 is one example, and the configuration of the pre-processor/post-processor 120A of the substrate processing apparatus 100 is not limited and other configurations may be applied.

The plating processor 120B includes a plurality of plating devices 39 including an overflow bath 38. Each plating device 39 houses one substrate therein, and the substrate is soaked in plating liquid retained therein to perform plating such as copper plating on the surface of the substrate. Here, the kind of the plating liquid is not particularly limited, and various kinds of plating liquid is used in accordance with use.

The substrate processing apparatus 100 includes a substrate holder transporter 37, applying a liner motor system for example, which is located at a side of each of these modules and transfers the substrate holder with the substrate among these modules. The substrate holder transporter 37 is configured to transfer the substrate holder 11 among the attaching/detaching system 29, the pre-wet module 32, the pre-soak module 33, the pre-rinse module 34, the blow module 35, the rinse module 36 and the plating devices 39.

A plating processing system which includes the substrate processing apparatus 100 with the above configuration includes the controller 175 configured to control each component described above. The controller 175 includes a memory 175B which stores various kinds of setup data and various kinds of programs, a CPU 175A which executes the program of the memory 175B and a control device 175C which is achieved when the CPU 175A executes the program. A recording medium constituting the memory 175B can include one or more of arbitrary recording media such as a ROM, a RAM, a hard disk, a CD-ROM, a DVD-ROM and a flexible disk. The program stored in the memory 175B includes, for example, a program which performs control of the adjusting system 26, a program which performs control regarding transportation of the substrate transporter 27, a program which performs control regarding attaching/detaching of the substrate to/from the substrate holder 11 in the attaching/detaching systems 29, a program which performs control regarding transportation of the substrate holder transporter 37, and a program which performs control regarding plating processing in each plating device 39. Also, the controller 175 is configured such that it can communicate with a not shown upper controller which performs overall control of the substrate processing apparatus 100 and other related devices to exchange data with a database included in the upper controller.

Figure 2:
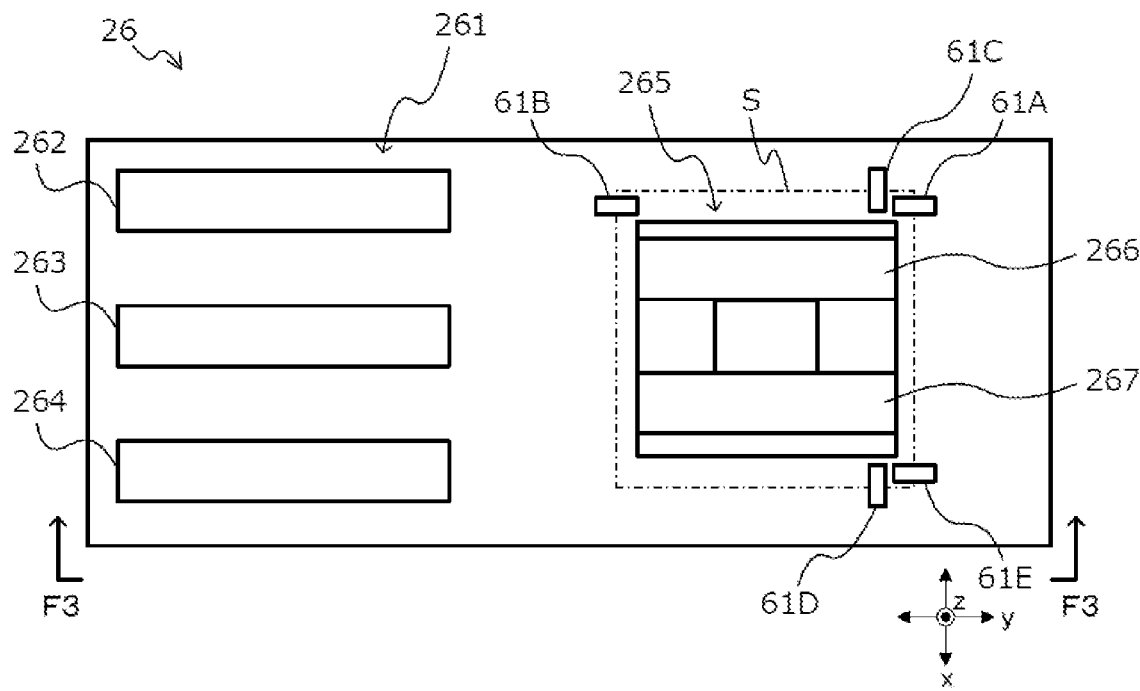
FIG. 2 is a schematic plan view for illustrating an adjusting system according to the first embodiment.
Figure 3:
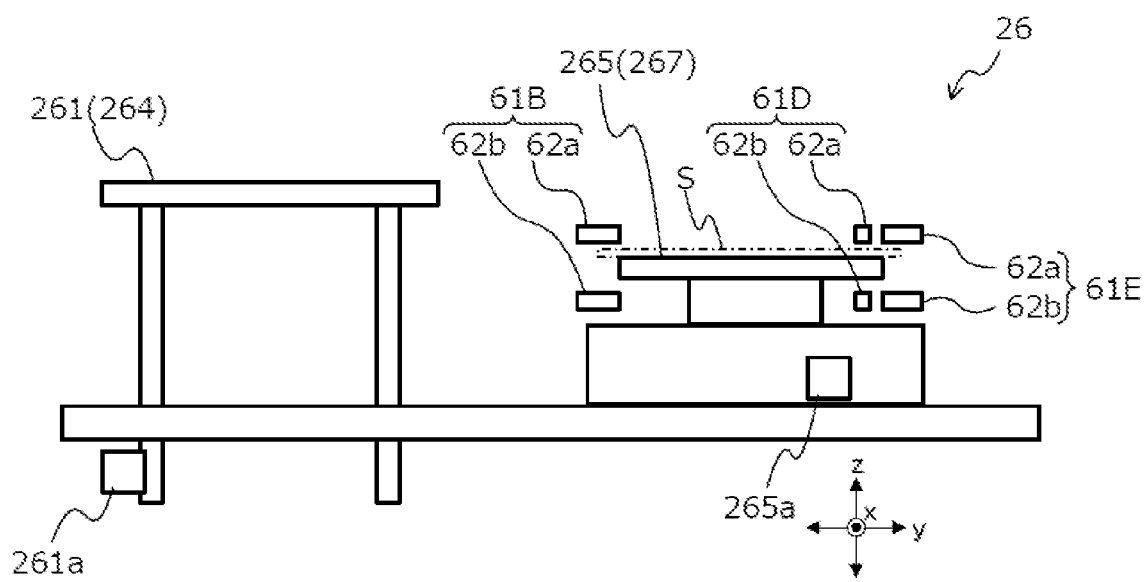
FIG. 3 is a schematic side view for illustrating the adjusting system according to the first embodiment.

The adjusting system 26 will be explained in detail. As described above, in this embodiment, the adjusting system for loading 26A and the adjusting system for unloading 26B have the same configuration although they differ in orientation by 180° in an arrangement, so that they are collectively referred to as the adjusting system 26. FIGS. 2 and 3 are schematic drawings which explain the adjusting system 26 according to the first embodiment, wherein FIG. 2 is a plan view, and FIG. 3 is a side view seen from a direction of a line F3-F3 (along the y direction) in FIG. 2. Additionally, in FIGS. 2 and 3, the substrate S is shown by a chain line. Also, hereinafter, an explanation will be made assuming that an up-down direction of FIG. 2 is "x direction," a right and left direction of FIGS. 2 and 3 is "y direction" and an up-down direction (vertical direction) of FIG. 3 is "z direction." In this embodiment, an explanation will be made taking an example that, as shown in FIGS. 2 and 3, first sensors 61 (61A to 61E) are provided to the adjusting system 26.

As shown in FIG. 2, the adjusting system 26 includes a temporary holder 261 and a handling stage 265 (a stage, a first adjusting module). The substrate S is taken out from the cassette 25a by the robot 24 and transferred to the temporary holder 261. The temporary holder 261 is configured such that the substrate S can be moved in the z direction (vertical direction) at its upper surface. Additionally, while it is assumed that a mount surface of the substrate S in the temporary holder 261 and the handling stage 265 is defined horizontally, that is, along the x direction and the y direction in this embodiment, this is not limited to such example. In the example shown in FIG. 2, the temporary holder 261 has three supporters 262, 263 and 264 mutually separated to support the substrate S mounted on the upper surface. The temporary holder 261 includes a controller 261a (see FIG. 3). The controller 261a communicates with the controller 175 (see FIG. 1) of the substrate processing apparatus and controls an operation of the temporary holder 261.

The handling stage 265 is configured to receive the substrate S mounted on the temporary holder 261 to be able to adjust the position and the orientation of the substrate S. The handling stage 265 includes two supporters 266, 267 mutually separated to support the substrate S mounted on its upper surface. Here, in this embodiment, the supporters 262 to 264 of the temporary holder 261 and the supporters 266, 267 of the handling stage 265 are configured to support mutually different regions of the substrate S. In other words, such a configuration is achieved that the temporary holder 261 supports a first region of the substrate S, while the handling stage 265 supports a second region which is different from the first region of the subtracted S. Also, the handling stage 265 is configured such that it does not overlap with a predetermined corner of the substrate S in the up-down direction (the z direction). The handling stage 265 is configured such that it can move the substrate S in the x direction and the y direction as well as can rotate the substrate S in θ direction around the z direction. The handling stage 265 includes a controller 265a (see FIG. 3). The controller 265a communicates with the controller 175 (see FIG. 1) of the substrate processing apparatus and controls an operation of the handling stage 265.

Figure 4:
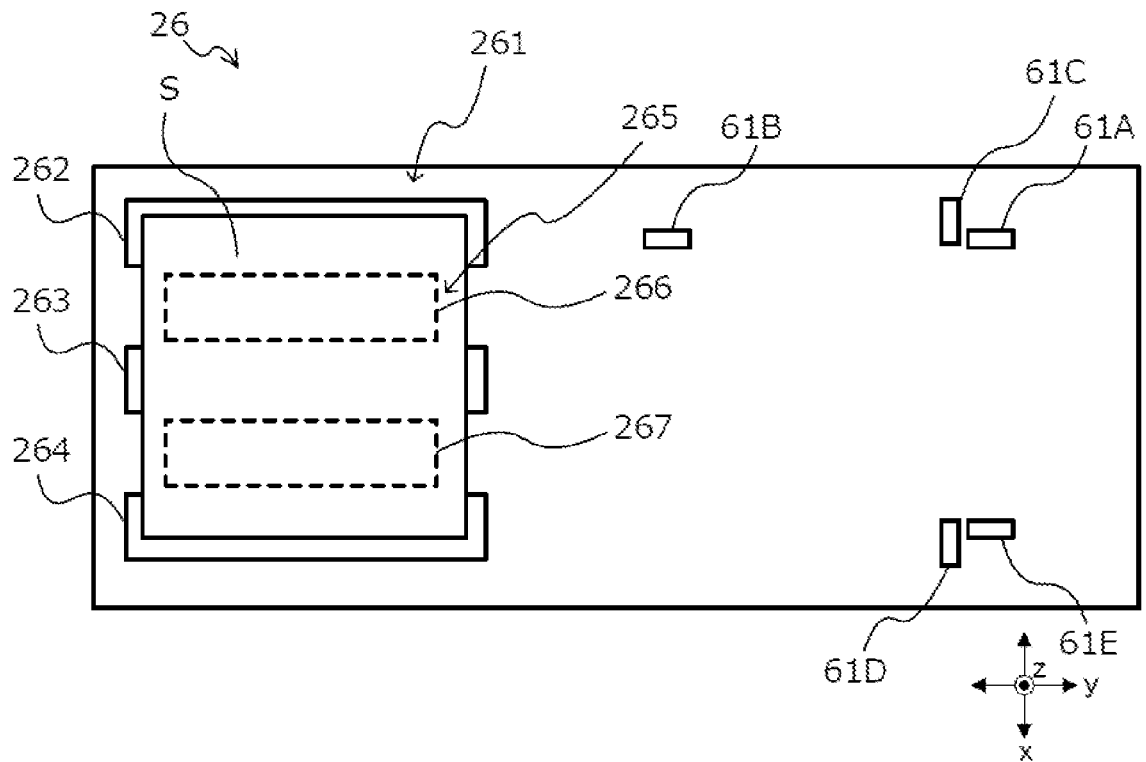
FIG. 4 is a drawing corresponding to FIG. 2, showing a state that a substrate is mounted on a temporary holder by a substrate transporter.
Figure 5:
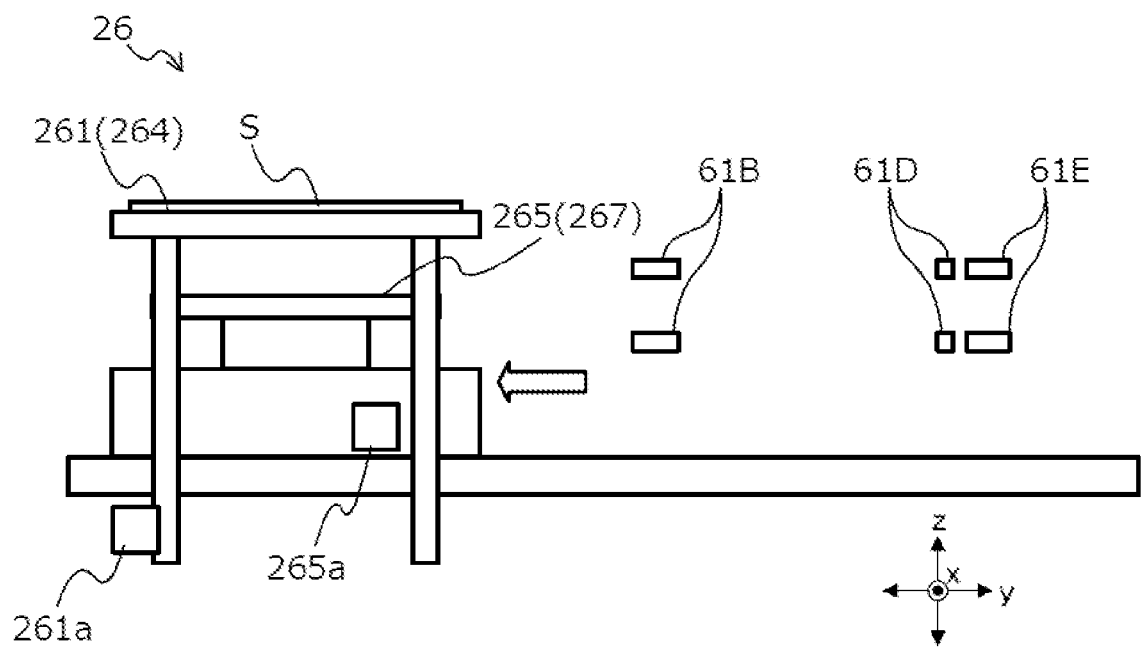
FIG. 5 is a drawing corresponding to FIG. 3, showing the state that the substrate is mounted on the temporary holder by the substrate transporter.

FIGS. 4 and 5 respectively correspond to FIGS. 2 and 3, showing a state that the substrate S is mounted on the temporary holder 261 by the substrate transporter 27. As shown in FIGS. 4 and 5, when the substrate S is mounted on the temporary holder 261 by the robot 24, subsequently the handling stage 265 is moved to an immediately lower portion of the temporary holder 261. Additionally, the handling stage 265 may be moved to the immediately lower portion of the temporary holder 261 before or at the same time when the substrate S is mounted on the temporary holder 261.

Figure 6:
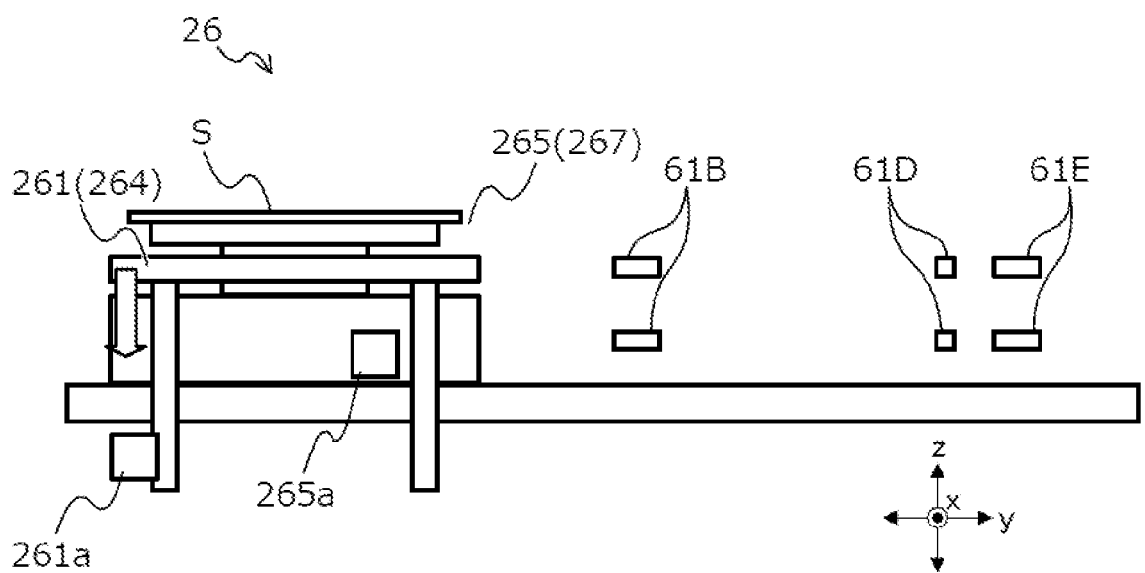
FIG. 6 is a drawing corresponding to FIG. 4, for illustrating delivery of the substrate from the temporary holder to a handling stage.

Subsequently, as shown in FIG. 6, the temporary holder 261 is moved downward (the z direction) to mount the substrate S on the handling stage 265. As described before, the temporary holder 261 and the handling stage 265 are configured to support the mutually different regions of the substrate S. Consequently, when the temporary holder 261 is moved downward, delivery of the substrate S can be performed without mutual interference between the supporters 262 to 264 of the temporary holder 261 and the supporters 266, 267 of the handling stage 265.

Figure 7:
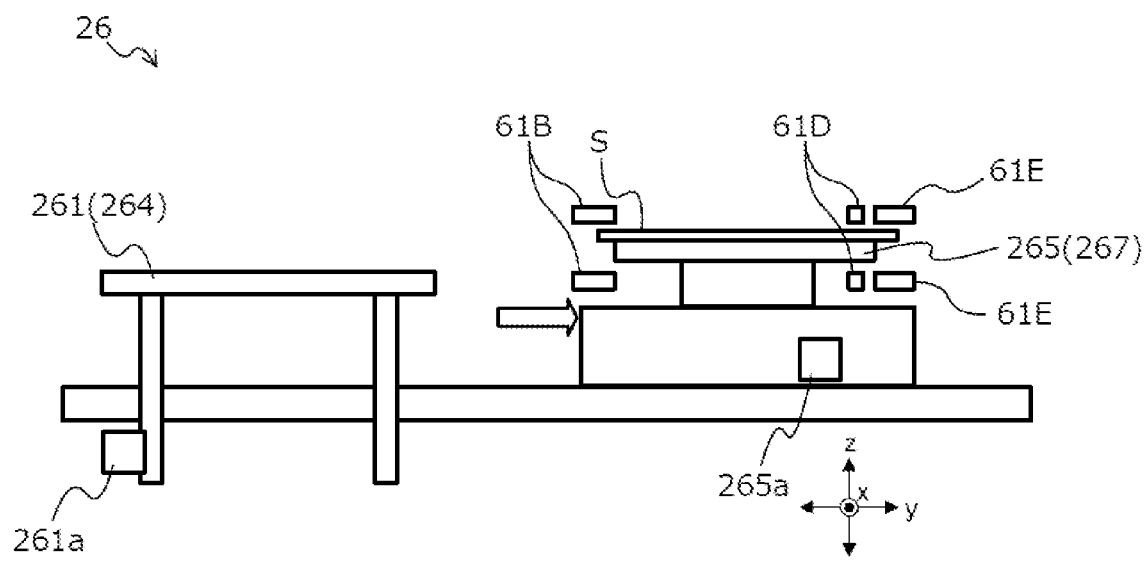
FIG. 7 is a drawing corresponding to FIG. 4, for illustrating moving of the substrate to an arrangement adjusting place by the handling stage.

Next, as shown in FIG. 7, the handling stage 265 is moved in the y direction to be moved from the immediately lower portion of the temporary holder 261 to an arrangement adjusting place (a robot delivery position) which is a predetermined place for adjusting an arrangement of the substrate. As shown in FIG. 7, at the arrangement adjusting place, the first sensors are arranged. Additionally, in the example shown in FIGS. 2 to 8, the first sensors 61 (61A to 61E) are deemed as fixed to the arrangement adjusting place irrespective of the position of the handling stage 265. Additionally, not limited to this example, the first sensors 61 may be moved integrally to the handling stage 265.

Figure 8:
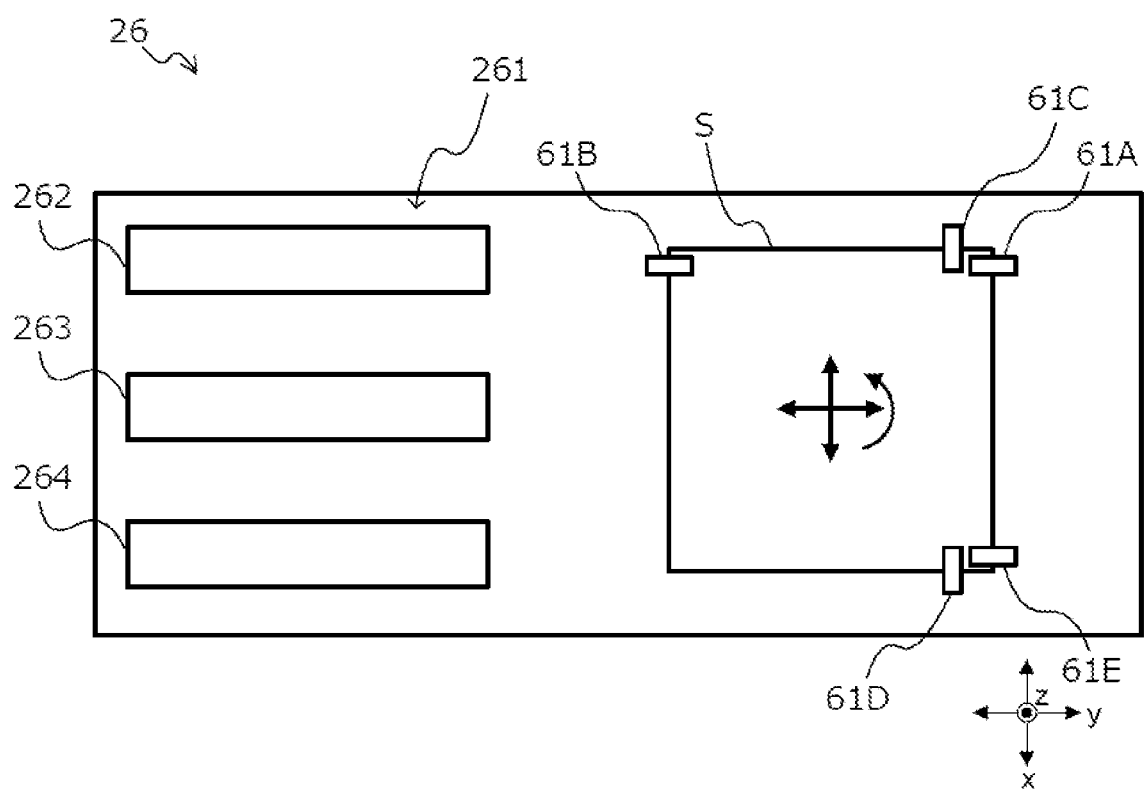
FIG. 8 is a drawing corresponding to FIG. 3, for illustrating arrangement adjustment of the substrate by the handling stage.

Moreover, as shown in FIG. 8, the handling stage 265 adjusts the position in the x direction and the y direction as well as a rotation angle θ (orientation) of the substrate S at the arrangement adjusting place. Here, the rotation angle θ of the substrate S is defined as an angle in which, in an x-y plane, a side along the x axis (or the y axis) of the substrate S is inclined to the x axis (or the y axis). Also, as desired, the handling stage 265 may change the orientation of the substrate S by 90° or 180°. When the arrangement of the substrate S is adjusted by the handling stage 265, subsequently the substrate S is transferred to the attaching/detaching module 290 by the substrate transporter 27.

Again, FIGS. 2 and 3 will be referenced. In this embodiment, the first sensors 61 (61A to 61E) are provided to the adjusting system 26. The first sensors 61 (61A to 61E) are arranged at a position at which an outer shape of the substrate S can be detected when the substrate S is transferred to a predetermined transportation position (a robot transportation position) by the handling stage 265. In this embodiment, as the first sensors 61, a plurality of (five for example) laser sensors 61A to 61E are applied. As one example, each of the laser sensors 61A to 61E has a light emitter 62a in which a plurality of laser-light emitter elements are aligned on a line and a receiver 62b in which a plurality of receiving elements are aligned on a line. The laser sensors 61A to 61E determine entrance of light/light shielding at each receiving element by comparing the amount of light received by the receiver 62b with a predetermined binarization level and can measure edges of the substrate S. As these laser sensors 61A to 61E, for example, IG series (as one example, IG-028) by KEYENCE CORPORATION may be used. By especially using these laser sensors, the outer shape of the substrate S can be measured with high accuracy irrespective of translucency of the substrate S. Additionally, any first sensor 61 may be applied as long as it can measure the outer shape of the substrate S to adjust the position of the substrate S, and one to four, or six or more sensors may be used. Also, not limited to the laser sensors 61, various kinds of sensors may be adopted as the first sensors, including a sensor accompanied with mechanical contact with the substrate S such as a mechanical switch or a pressure sensor, an image sensor and an ultrasonic sensor.

Figure 10:
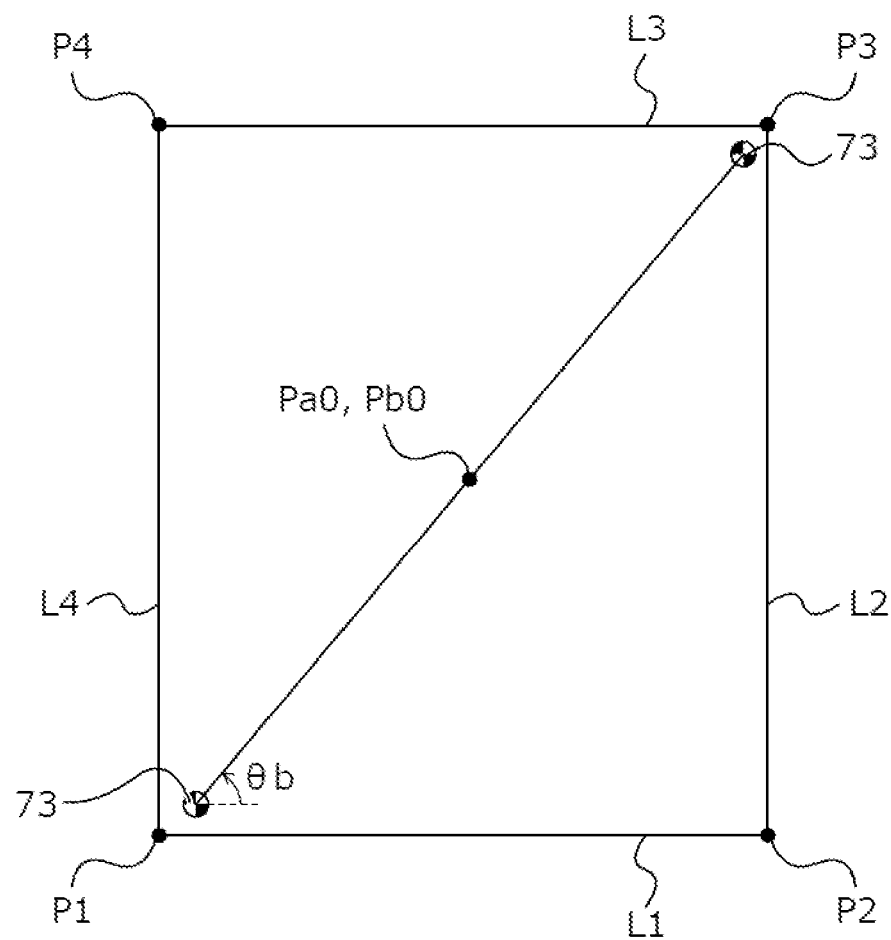
FIG. 10 is a schematic drawing showing an example of a plan view of the substrate.

In this embodiment, the substrate S is a rectangular substrate which is substantially rectangular, and has four sides L1, L2, L3 and L4 and four corners P1, P2, P3 and P4 (see FIG. 10). Also, a center Pa0 of the substrate S can be defined as an intersection of two diagonal lines. Moreover, in this embodiment, as shown in FIG. 2, a total of five laser sensors are used as the first sensors 61, which are the laser sensors 61A, 61B for measuring positions of first facing edges (L1, L3) of the substrate S, the laser sensors 61C, 61D for measuring positions of second facing edges (L2, L4) of the substrate S and the laser sensor 61E for measuring the rotation angle θ together with any of the laser sensors 61A to 61D. The five laser sensors 61A to 61E are fixed to a not shown frame in the substrate processing apparatus 100, and a position of each sensor is previously calibrated. In the first sensors 61, based on detection of the positions of the first facing edges by the laser sensors 61A, 61B, the dimension in the first direction (they direction) and a center position (ya0) in the first direction (the y direction) are measured. Also, based on detection of the positions of the second facing edges by the laser sensors 61C, 61D, the dimension in the second direction (the x direction) and a center position (xa0) in the second direction (the x direction) are measured. Further, based on detection by any of the laser sensors 61A to 61D (for example, the laser sensor 61A) and the laser sensor 61E, a rotation angle θa0 of the substrate S is measured. Moreover, based on the measured positions of the substrate S, the handling stage 265 adjusts the position in the x direction and the y direction as well as the rotation angle θ (orientation) of the substrate S such that the substrate S is arranged at a predetermined target setup position (a first target setup position). In this embodiment, "a target setup position (the first target setup position)" is defined as a correct position where the substrate S should be located when the substrate S is arranged at the arrangement adjusting place by the handling stage 265. Additionally, although not limited to this, in a case where, by the handling stage 265, the orientation of the substrate S is changed by a previously determined angle, 90° or 180° for example, the target setup position may be a correct position where the substrate S after orientation change should be located. In this embodiment, as a reference value corresponding to the first target setup position, a target center position (xat, yat) of the center of the substrate S and a target rotation angle θat of the substrate S are used.

In the adjusting system for loading 26A, when the arrangement of the substrate S is adjusted by the handling stage 265 (the first adjusting module), the substrate S is transferred to the attaching/detaching system 29 by the transfer robot 270. Additionally, in the adjusting system for loading 26B, when the arrangement of the substrate S is adjusted at the handling stage 265, the substrate S is returned to the cassette 25a by the robot 24. In this way, the substrate S can be returned to the cassette 25a in a state that the arrangement is adjusted.

Figure 9:
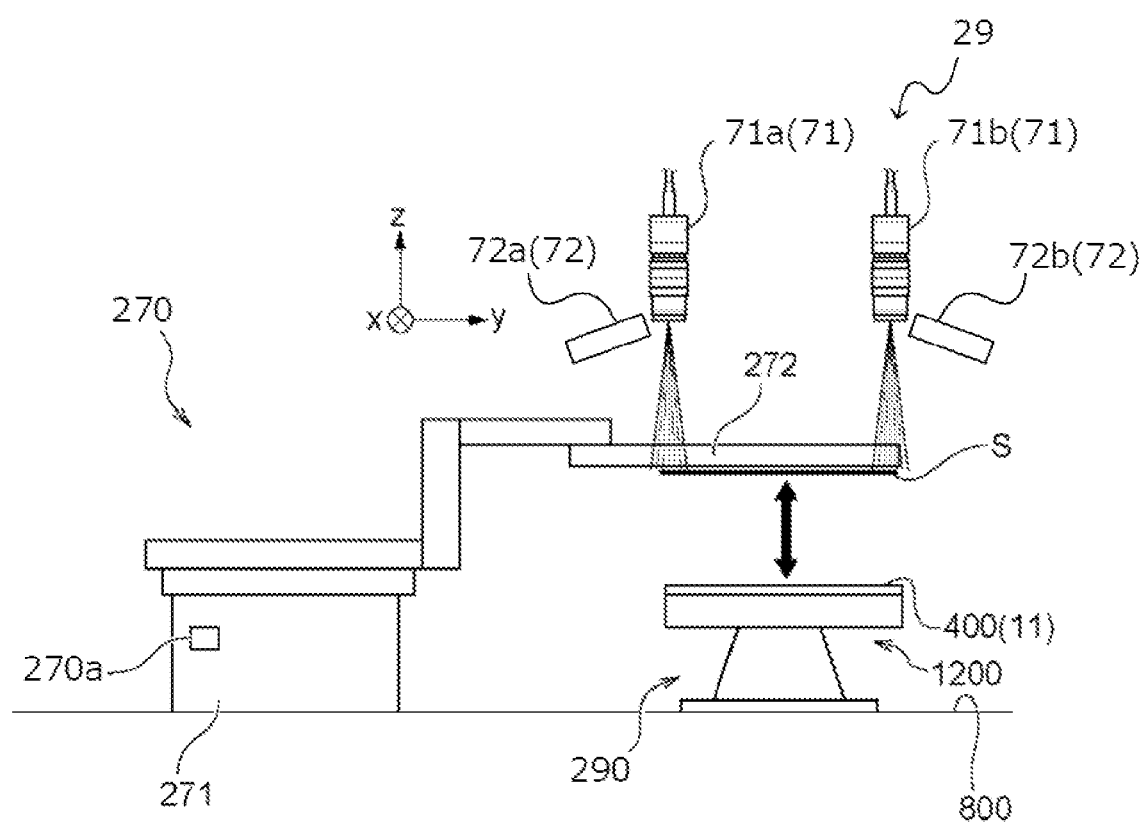
FIG. 9 is a drawing for illustrating the arrangement adjustment of the substrate in an attaching/detaching system.

FIG. 9 is a drawing for illustrating arrangement adjustment of the substrate S in the attaching/detaching system 29. Additionally, while an example of the attaching/detaching system 29 is shown in FIG. 9, the attaching/detaching system is not limited to such example. For example, as the attaching/detaching system, an attaching/detaching system disclosed in Japanese Patent Application No. 2018-190116 may be used. In an example shown in FIG. 9, the attaching/detaching system 29 includes an attaching/detaching module 290 having a rotator 1200. To the rotator 1200, a second holding member 400 of the substrate holder 11 is attached. In this state, the substrate S is attached to the second holding member 400. The substrate S is transferred to the second holding member 400 by the transfer robot 270. Additionally, the substrate holder 11 is a member which further includes a not shown first holding member to sandwich the substrate S between the first holding member and the second holding member 400 for holding.

The transfer robot 270 includes a robot main body 271, a robot hand 272 attached to the robot main body 271 and a controller 270a. With the controller 270a, an operation of the robot hand 272 is controlled. The robot hand 272 can hold the substrate S by contact or in a non-contact manner. The robot hand 272 holds the substrate S in a non-contact manner by a Bernoulli chuck, for example. The robot hand 272 is also desired to have a chuck which regulates a position of the substrate in an X-Y plane to the robot hand. The transfer robot 270 is a multi-axis robot and can move the position of the substrate S held by the robot hand 272 in the x, y, z directions and the rotation direction (the θ direction). The x, y, z axes are defined as the directions shown in FIG. 9. The x axis and y axis are parallel with an installation surface 800 and the z axis is perpendicular to the installation surface 800. Additionally, two or more robot hands may be provided.

In this embodiment, the transfer robot 270 corresponds to a second adjusting module, and the arrangement of the substrate S is further adjusted by the transfer robot 270 at the attaching/detaching system 29 before the substrate S is set to the attaching/detaching module 290. In this embodiment, "a target setup position (a second target setup position)" is defined as a correct position where the substrate S should be located when the substrate S is arranged at the attaching/detaching module 290 by the transfer robot 270.

Second sensors 71 are provided to the attaching/detaching system 29. Each second sensor 71 is a sensor which can detect a characteristic point (for example, a predetermined alignment mark, or a pattern such as a recess or a mask) formed in advance at a plate surface of the substrate S, for example, an image sensor. Also, in an example shown in FIG. 9, second illuminators 72 (72a, 72b) are provided at the same side as the second sensors 71 (71a, 71b) of the substrate S. In the example shown in FIG. 9, both the second sensors 71 and the second illuminators 72 are provided above the substrate S. The second illuminators 72 are a top light by an LED, for example. Additionally, although not limited, the second illuminators 72 are preferably provided to be inclined to the plate surface of the substrate S such that an illumination light by the second illuminators 72 does not directly enter the second sensors 71 by reflection. At the time of image-capturing of the plate surface of the substrate S by the second sensors 71, the substrate S is illuminated by the second illuminators 72, so that the characteristic point formed in advance at the plate surface of the substrate S can be clarified. Additionally, the substrate processing apparatus 100 may exclude such illuminators 72.

Figure 11:
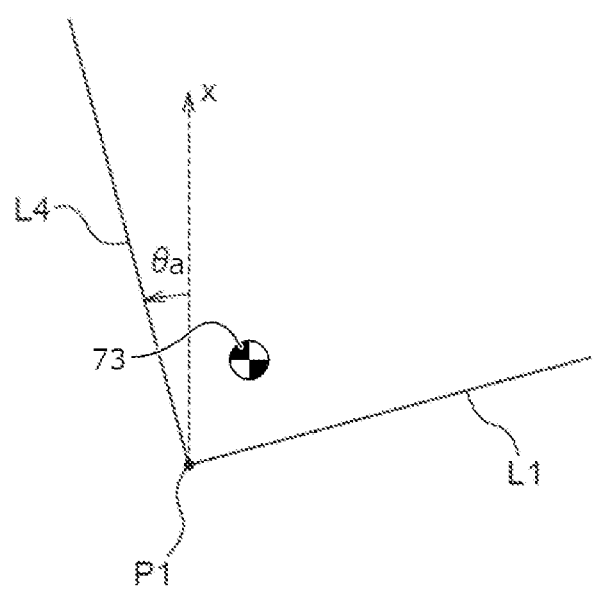
FIG. 11 is a drawing for illustrating a rotation angle of the substrate.

Subsequently, an imaging position of the substrate S by the second sensors 71 and the target setup position (the second target setup position) of the substrate S in the attaching/detaching system 29 will be explained in detail. FIG. 10 is a drawing schematically showing an example of a plan view of the substrate S. FIG. 11 is a drawing for illustrating a rotation angle of the substrate S. As described before, in this embodiment, the substrate S is the rectangular substrate which is substantially rectangular, and has the four sides L1, L2, L3 and L4 and the four corners P1, P2, P3 and P4. Also, as shown in FIGS. 10 and 11, in this embodiment, alignment marks 73 are formed in advance on the substrate S. The alignment marks 73 are formed in advance as the characteristic point to be detected by the second sensors 71 before the substrate S is inserted in the substrate processing apparatus 100. These alignment marks 73 are preferably formed together with the pattern such as the recess or the mask formed on the substrate S before the insertion into the substrate processing apparatus 100. Additionally, any alignment mark 73 may be applied as long as the position can be detected by the second sensors 71, and any shape and dimension may be applied. Moreover, a position where the characteristic point in the substrate S should be formed is previously stored in any of the controllers of the substrate processing apparatus 100. More specifically, in this embodiment, as a reference value corresponding to the second target setup position, a target position (xbt, ybt) of a midpoint of the alignment marks 73 and a target inclination angle θbt are previously stored. Although not limited, the alignment marks 73 are preferably provided at positions adjacent to at least two of the corners P1 to P4 of the substrate S. In particular, the alignment mark 73 are preferably provided at positions adjacent to two corners on the diagonal line of the substrate S. As one example, in this embodiment, the alignment marks 73 are provided at positions adjacent to the two corners P1, P3. Also, although not limited, in this embodiment, when there is no misregistration, the two alignment marks 73 are provided at positions which are symmetrical to the center of the substrate S, and the midpoint Pb0 of the two alignment marks 73 corresponds to the center Pa0 of the substrate S. Additionally, while the two alignment marks 73 are formed as the characteristic point at the substrate S in this embodiment, one, or three or more alignment marks 73 may be formed. Also, instead of or in addition to the alignment marks 73, the pattern such as the recess or the mask formed in advance at the plate surface of the substrate S may be used as the characteristic point formed in advance at the plate surface of the substrate S.

Figure 12:
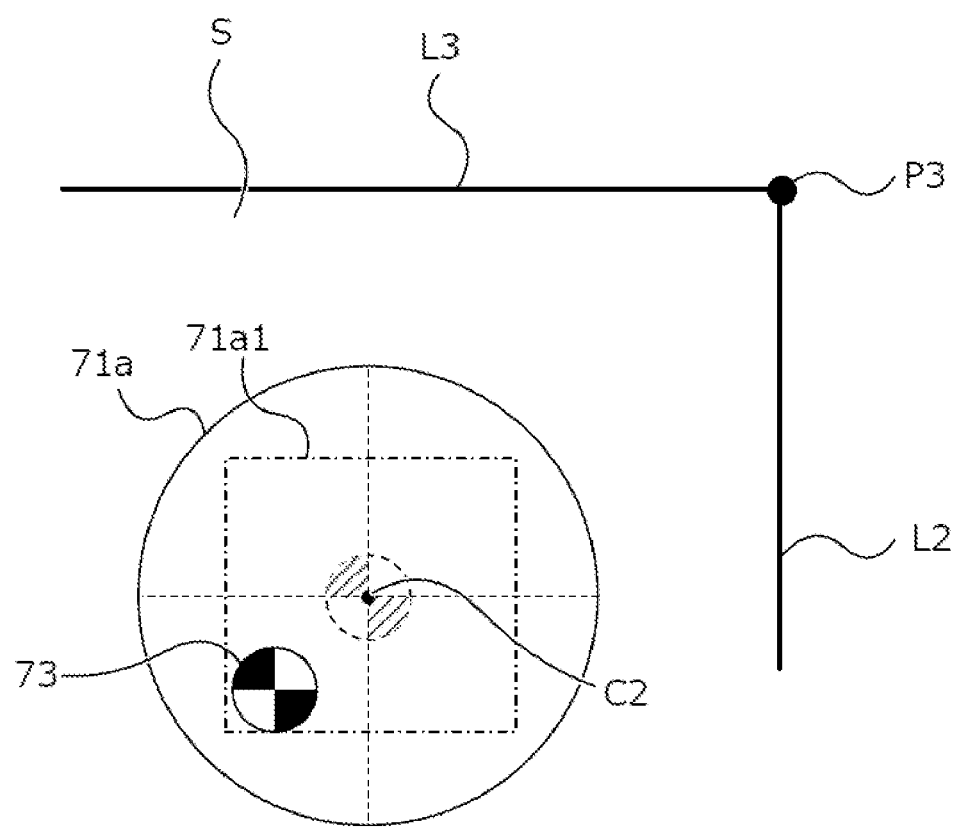
FIG. 12 is a drawing for illustrating an image-capturing position of a second sensor.
Figure 13:
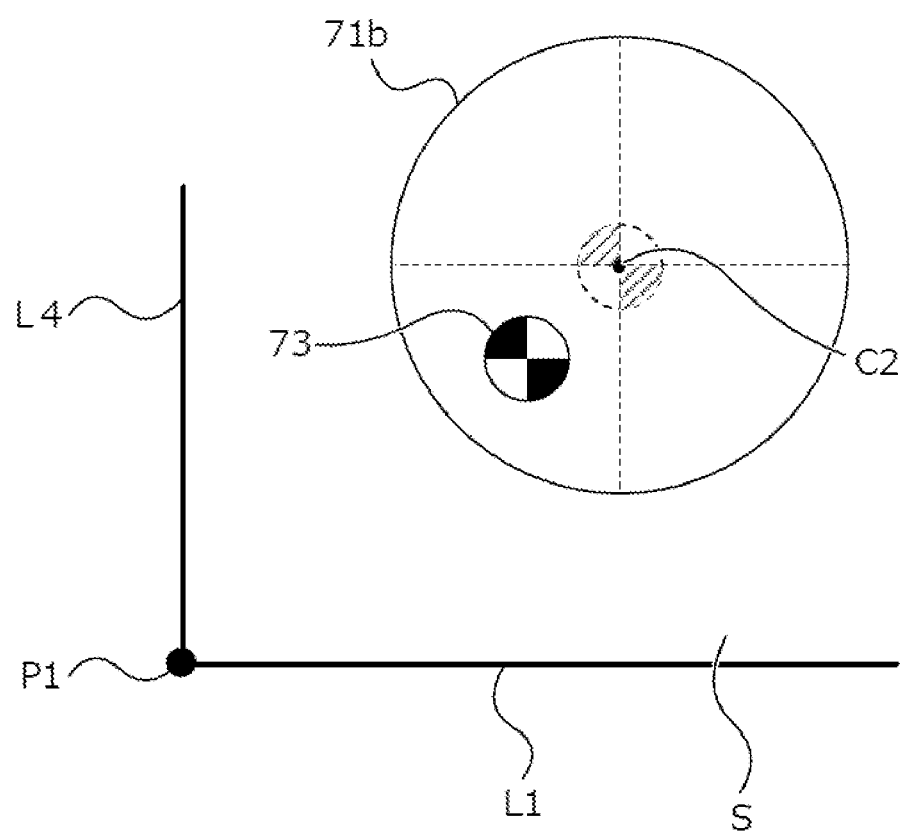
FIG. 13 is a drawing for illustrating the image-capturing position of the second sensor.

FIGS. 12 and 13 are drawings for illustrating an imaging position by the second sensors 71a, 71b. Each of the second sensors 71a, 71b is fixed to a not shown frame in the substrate processing apparatus 100 such that the alignment marks 73 can be shot when the substrate S is transferred to an assumed position (the second target setup position) in the attaching/detaching module 290 by the transfer robot 270. In this embodiment, as shown in FIGS. 12 and 13, the second sensors 71a, 71b are provided such that a center C2 of its imager (for example, a lens) is arranged at a position corresponding to a center of the alignment mark 73 of the substrate S when the substrate S is arranged at the assumed position (immediately above the second holding member 400, the second target setup position) in the attaching/detaching system 29 in plan view. Additionally, in FIGS. 12 and 13, an example where the alignment marks 73 are located at the assumed positions (the center C2 of the imager) is shown in dashed lines, while an example where the positions of the alignment marks 73 are shifted from the center C2 of the imager is shown in solid lines.

In these second sensors 71, based on the positions of the alignment marks 73 measured by the two second sensors 71a, 71b, a position of the midpoint (xb0, yb0) and an inclination angle θW of a line connecting the two alignment marks 73 are calculated. Additionally, the controller may perform image processing of the entire image area by the second sensors 71 to detect the position of the alignment marks 73 or may perform image processing of a region (a region 71a1 in FIG. 12) adjacent to the assumed position (the center C2 of the imager) of the alignment marks 73. Also, in this embodiment, as the reference value corresponding to the second target setup position, a target midpoint position (xbt, ybt) and a target inclination angle θbt are used. Moreover, the transfer robot 270 moves the substrate S in a horizontal direction (the x direction and the y direction) and a rotation direction to adjust the position of the substrate S such that the position of the midpoint (xb0, yb0) of the alignment marks 73 and the inclination angle θb0 by the second sensors 71 approach the reference value in the second target setup position.

Figure 14:
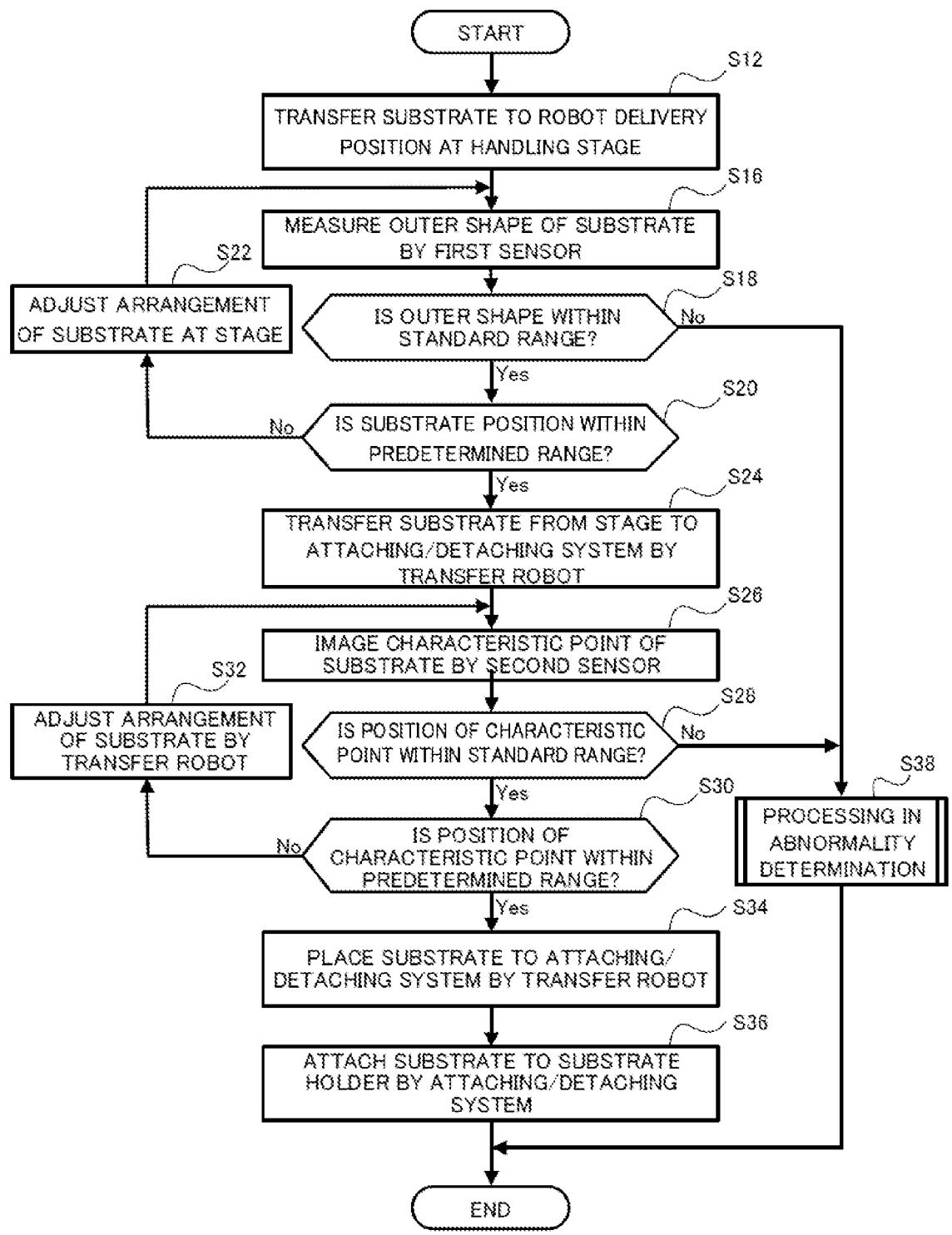
FIG. 14 is a flowchart showing an example of processing of the arrangement adjustment of the substrate performed by each controller in the substrate processing apparatus.

Next, the arrangement adjustment of the substrate S in the substrate processing apparatus 100 will be explained with reference to a flowchart. FIG. 14 is a flowchart showing an example of processing of the arrangement adjustment of the substrate S performed by at least one of various controllers (this is simply referred to as "a controller") in the substrate processing apparatus 100. This processing is started when the substrate S is placed on the adjusting system 26 (the adjusting system for loading 26A) by the robot 24.

First, the substrate S is delivered from the temporary holder 261 to the handling stage 265, and the substrate S is transferred to the robot delivery position by the handling stage 265 (step S12). This processing in step S12 has been explained before with reference to FIGS. 2 to 7 etc. Additionally, in a case where the substrate S is rotated by 90° or 180° etc. at the handling stage 265, the controller rotates the substrate S. Additionally, the rotation of the substrate S may be performed after measurement by the first sensors 61 which will be explained below. Also, the controller may determine whether the substrate S is rotated based on the measurement by the first sensors 61.

Subsequently, the outer shape of the substrate S is measured by the first sensors 61 (step S16). In this way, the dimension, position and rotation angle of the substrate S are calculated. Moreover, the controller determines whether the outer shape (dimension) of the substrate S is within a standard range (step S18). As the standard range, a previously determined range may be applied, for example, within an error of a small percent to a desired substrate dimension. In step S18, it is determined that the outer shape of the substrate S is out of the standard range when the substrate S is significantly warped, for example. Moreover, when the outer shape of the substrate S is not within the standard range (out of the standard range) (step S18: No), the controller performs a predetermined processing in abnormality determination (step S38) to terminate the processing of the arrangement adjustment. As the processing in abnormality determination, for example, the controller returns the substrate S to the cassette 25a (by controlling the substrate processing apparatus 100) without performing any subsequent processing to the substrate S. Alternatively, the substrate S may be transferred to a predetermined place which is different from a delivery place at a normal time. Also, as the processing in abnormality determination, notification of abnormality may be included such as issuing an alarm in the substrate processing apparatus 100 or sending an abnormal signal to the outside from the substrate processing apparatus 100. In this way, an administrator etc. of the substrate processing apparatus 100 can recognize that abnormality of the substrate S is determined.

Next, it is determined whether an error between the coordinate of the center position (xa0, ya0) of the substrate S as well as the rotation angle θa0 calculated from the measurement by the first sensors 61 and the reference value corresponding to the first target setup position (the target center position (xat, yat) and the target rotation angle θat=0) is within a predetermined range (step S20). Here, as the predetermined range, a previously determined range based on the accuracy of the arrangement adjustment by the handling stage 265 etc. may be used. Moreover, when the error between the calculated coordinate of the center position (xa0, ya0) as well as rotation angle θa0 and the target center position as well as rotation angle is out of the predetermined range (step S20: No), the arrangement of the substrate S is adjusted such that the arrangement of the substrate S approaches the target setup position (the first target setup position) by moving the handling stage 265 in the x direction, the y direction and/or the rotation direction θ in the x-y plane based on the amount of error (step S22). After that, the processing of steps S16, S20 and S22 is repeatedly performed until the error between the coordinate of the center position of the substrate S as well as the rotation angle calculated from the measurement by the first sensors 61 and the target center position as well as rotation angle is within the predetermined range. Moreover, when the error between the coordinate of the center position of the substrate S as well as the rotation angle calculated from the first sensors 61 and the target center position as well rotation angle is within the predetermined range (step S20: Yes), it proceeds to step S24 to perform processing which will be explained later. In this way, the outer shape of the substrate S is detected by the first sensors 61 and the arrangement of the substrate S is adjusted based on the detected result, thereby adjusting the arrangement of the substrate S with high accuracy.

Additionally, in this embodiment, the arrangement adjustment of the substrate S by the handling stage 265 can be performed with high accuracy, and usually, the substrate S is arranged within a predetermined range to the target setup position (the first target setup position) by performing the arrangement adjustment one time (step S22). Consequently, it is acceptable that the substrate processing apparatus 100 adjusts the arrangement of the substrate S by the handling stage 265 in the processing of step S22, and thereafter it proceeds to step S24 to perform processing of the subsequent steps without returning to the processing of step S16. Also, in the processing shown in FIG. 14, when it is determined that the error is out of the predetermined range to the same substrate S in step S20 more than once (for example, two or three times), the substrate processing apparatus 100 may determine that abnormality occurs in the handling stage 265 or the first sensors 61.

When the arrangement of the substrate S is adjusted to within the predetermined range to the first target setup position based on the measurement by the first sensors 61, the controller allows the transfer robot 270 to transfer the substrate S to the attaching/detaching module 290 (step S24). The transfer robot 270 is previously adjusted such that the substrate S is transferred to the assumed position (the second target setup position) in the attaching/detaching module 290. In step S24, the substrate S is remained to be held by a hand of the transfer robot 270. In this embodiment, the transportation of the substrate S by the transfer robot 270 can be performed with high accuracy, so that the arrangement adjustment by the handling stage 265 is maintained and the substrate S is transferred to the attaching/detaching module 290.

Subsequently, in the attaching/detaching module 290, the characteristic point of the substrate S (in this embodiment, the alignment marks 73) is imaged by the second sensors 71 (step S26). From this image, the coordinate of the midpoint position of the characteristic point (xb0, yb0) and the inclination angle θb0 of the line connecting the characteristic points are calculated.

Next, the controller determines whether an error between the calculated coordinate of the midpoint (xb0, yb0) as well as inclination angle θb and the reference value corresponding to the second target setup position (the target midpoint position (xbt, ybt) and the target inclination angle θbt) is within a predetermined allowable range (step S28). Additionally, although "whether the position of the characteristic point is within the allowable range" is determined in step S28 of FIG. 14, this is comprehensively described for convenience of illustration and in terms of an inventive concept. In this embodiment, the determination in step S28 is performed based on the positional relationship of the two alignment marks 73 as the characteristic point. Here, as the allowable range, as a range for determining abnormality of the substrate S, a previously determined range based on accuracy of the arrangement adjustment of the handling stage 265 as well as the transfer robot 270 and a misregistration range of the substrate which is allowable when the substrate S is held in the substrate holder etc. may be used. The arrangement of the substrate S is adjusted by the handling stage 265 based on the measurement of the outer shape by the first sensors 61, and usually, the position of the characteristic point calculated from the measurement by the second sensors 71 is within the allowable range to the reference value corresponding to the second target setup position. Moreover, when the position of the characteristic point calculated from the measurement by the second sensors 71 is within the allowable range (step S28: Yes), the controller determines whether the position of the characteristic point subsequently calculated is within a predetermined range (step S30). In this embodiment, in the same manner as the processing in step S28, the processing of step S30 is to determine whether the error between the calculated coordinate of the midpoint (xb0, yb0) as well as inclination angle θb and the reference value corresponding to the second target setup position (the target midpoint position (xbt, ybt) and the target inclination angle θbt) is within a predetermined range. Here, as the predetermined range, as a range for determining whether the arrangement adjustment of the substrate S should be performed, a previously determined range based on a misregistration range of the substrate which is allowable to uniformity of plating and the accuracy of delivery of the substrate S to the substrate holder 11 by the transfer robot 270 or the attaching/detaching system 29 etc. may be used. Also, the predetermined range in step S30 is smaller than the allowable range in step S28. When the calculated position of the characteristic point is not within the predetermined range (out of the predetermined range) (step S30: No), the arrangement of the substrate S is adjusted such that the substrate S approaches the second target setup position by moving the hand of the transfer robot 270 in the x direction, the y direction and/or the rotation direction θ in the x-y plane based on the error between the calculated position of the characteristic point and the second target setup position (step S32). Thereafter, the processing of steps S26, S30, S32 are repeatedly performed until the error between the position of the midpoint of the characteristic points calculated from the measurement by the second sensors 71 as well as the inclination angle and the reference value corresponding to the second target setup position is within the predetermined range.

When the position of the characteristic point calculated from the measurement by the second sensors 71 is within the predetermined range (step S30: Yes), the controller allows the transfer robot 270 to place the substrate S to the attaching/detaching system 29 (step S34). Moreover, the controller controls the attaching/detaching system 29 to attach the substrate S to the substrate holder 11 (step S36), and terminates the processing. Alternatively, the transfer robot 270 may directly deliver the substrate S to the second holding member 400 of the substrate holder 11. In this way, in this embodiment, the characteristic point of the substrate S is measured by the second sensors 71, and the arrangement of the substrate S is adjusted based on the measurement result and the substrate S is attached to the substrate holder 11. In this way, even in a case where the substrate S is warped or in a case where substrate alignment based on the outer shape using a camera cannot be performed since the substrate S is a transparent substrate, the substrate S can be held by the substrate holder 11 at an appropriate position, and the subsequent processing can be performed in a more suitable manner.

On the other hand, in step S28, the error between the coordinate (xb0, yb0) as well as the inclination angle θb calculated from the measurement by the second sensors 71 and the reference value corresponding to the second target setup position is out of the allowable range (step S28: No), the controller determines that the position of the characteristic point in the substrate S is abnormal, and performs the predetermined processing in abnormality determination (step S38). Again stated, in the determination in step S28, the arrangement of the substrate S is previously adjusted based on a calculated value from the measurement by the first sensors 61. Consequently, when the position of the characteristic point measured by the second sensors 71 is significantly shifted from a place where the characteristic point should be formed (a reference value at the second target setup position), the controller determines that abnormality occurs in the substrate S, for example, the pattern of the substrate S is significantly misaligned or the outer shape of the substrate S is missing. With such determination, the abnormality of the substrate S can be determined with high accuracy. As the processing in abnormality determination when it is determined that abnormality occurs in the substrate S, for example, the controller returns the substrate S to the cassette 25a (by controlling the substrate processing apparatus 100) without performing any subsequent processing to the substrate S. Alternatively, the substrate S may be transferred to a predetermined place which is different from a delivery place at a normal time. Also, as the processing in abnormality determination, notification of abnormality may be included such as issuing the alarm in the substrate processing apparatus 100 or sending the abnormal signal to the outside from the substrate processing apparatus 100. In this way, the administrator etc. of the substrate processing apparatus 100 can recognize that abnormality of the substrate S is determined. Significant misalignment of the pattern of the substrate S, in many cases, can be considered as poor as an article. According to this embodiment, without performing plating, a poor substrate can be excluded from a manufacturing line. Also, in a case where the pattern of the substrate S is misaligned, when alignment of the substrate is performed based on the characteristic point, position adjustment is performed when the substrate itself has a significant displacement. In such a case, there is a possibility that the substrate S overrides the substrate holder 11 or an interface of the substrate holder 11 is prevented from contacting at a correct position, so that the substrate holder 11 cannot hold the substrate S appropriately. According to this embodiment, a problem caused by misalignment of the pattern of the substrate S is avoided to perform alignment of the substrate based on the characteristic point, which allows the substrate holder 11 to hold the substrate S.

Second Embodiment

Figure 15:
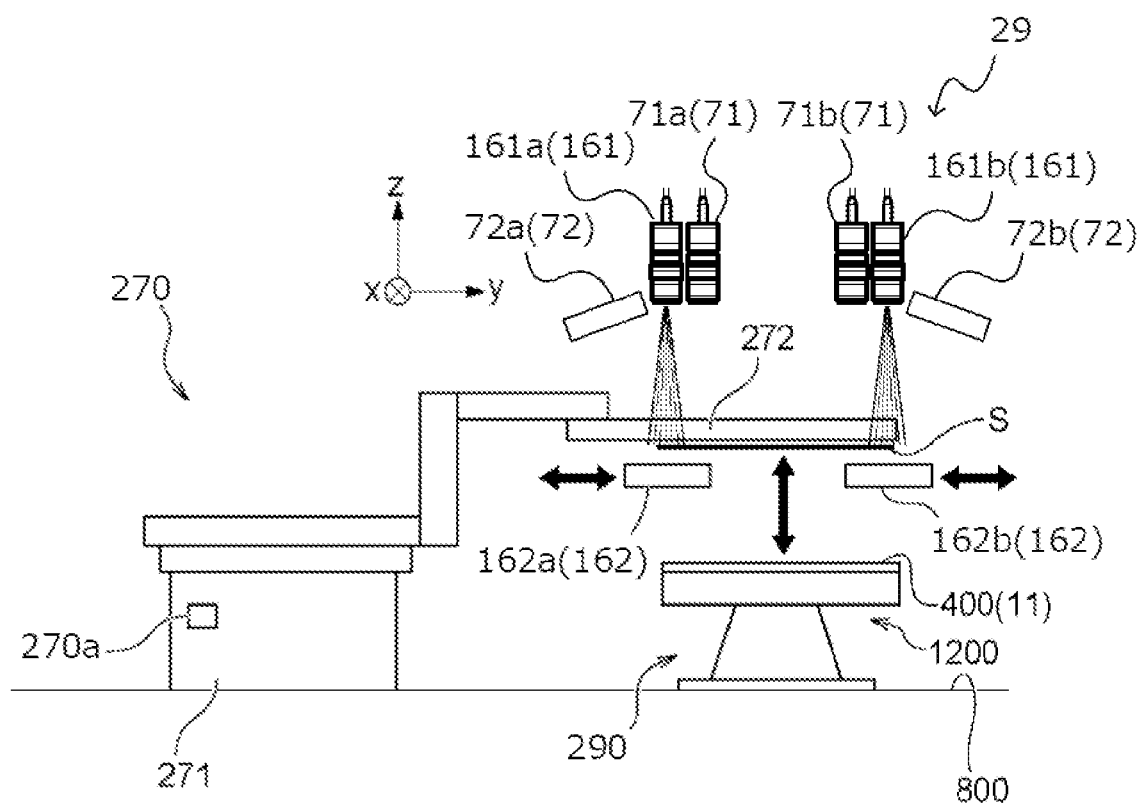
FIG. 15 is a schematic drawing for illustrating the arrangement adjustment of the substrate in the second embodiment.

FIG. 15 is a schematic drawing for illustrating arrangement adjustment of the substrate S in the second embodiment. In the substrate processing apparatus in the second embodiment, first sensors and the second sensors 71 are provided to the attaching/detaching system 29. More specifically, in the second embodiment, as the first sensors 161, a plurality of (two as one example) image sensors 161a, 161b are provided to be fixed to a not shown frame of the attaching/detaching system 29. Also, in the second embodiment, first illuminators 162 (162a, 162b) are provided at the opposite side from the first sensors 161 (161a, 161b) of the substrate S. In an example shown in FIG. 15, the first sensors 161 are provided above the substrate S, while the first illuminators 162 are provided below the substrate S. The first illuminators 162 are arranged to illuminate the corners of the substrate S at the opposite side from the first sensors 161. The first illuminators 162 are a back light by an LED, for example. At the time of image-capturing of the corners of the substrate S by the first sensors 161, when the substrate S is illuminated by the first illuminators 162 from the opposite side, a background of the substrate S becomes white and an outline of the substrate S can be clarified.

Each first illuminator 162 is configured to be movable between an image-capturing position which is a position corresponding to each first sensor 161 and a retracted position moved to an outer side from the image-capturing position. This configuration does not inhibit a delivery route of the substrate S to the second holding member 400 by the robot hand 272. As a mechanism for moving the first illuminators 162, a mechanism using various power sources, including a motor, solenoid or a pneumatic actuator, can be applied.

Figure 16:
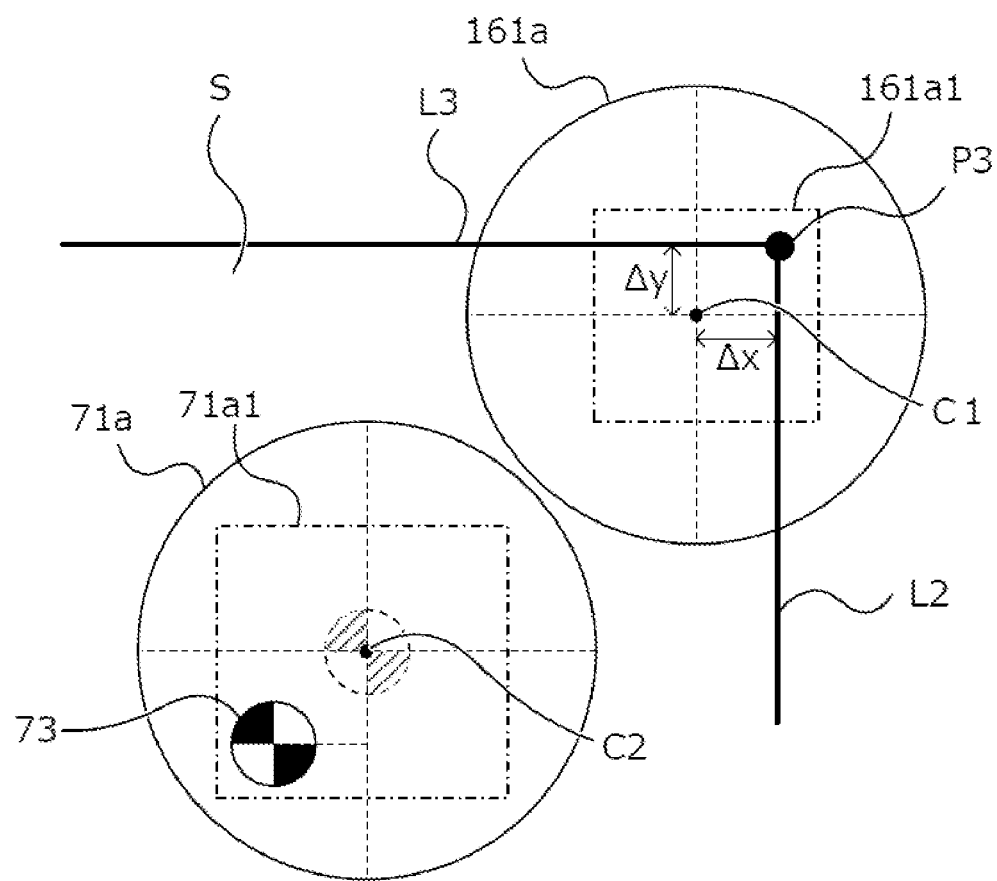
FIG. 16 is an explanation view for illustrating image-capturing positions of a first sensor and the second sensor in the second embodiment.

FIG. 16 is an explanation view for illustrating image-capturing positions of the first sensors 161 and the second sensors 71 in the second embodiment. Here, the image-capturing position of the second sensors 71 is identical to that in the first embodiment, so that its explanation is omitted. As shown in FIG. 16, the first sensors 161 are provided such that a center C1 of an imager (for example, a lens) of each first sensor 161 is arranged at a position displaced to an inner side in the x direction and the y direction by a predetermined distances Δx, Δy in plan view from the corners P1, P3 of the substrate S placed at an assumed position (the target setup position or a position rotated from the target setup position by 90° or 180° etc.) In other words, each center C1 of the first sensors 161a, 161b corresponds to a position located at an inner side of the substrate S than a position of the corner (vertex) of the substrate S. With this configuration, by the first sensors 161, a wider area adjacent to the corners P1, P3 of the substrate S can be shot, which improves detection accuracy of the position of the corners. For example, a longer area of two adjacent sides at each corner (two adjacent sides (L1-L4, L2-L3)) can be shot, which improves calculation accuracy of the position of the corners P1, P3 as an intersection of the two adjacent sides and calculation accuracy of the rotation angle θ of the substrate S calculated from an inclination of at least one of the two adjacent sides. Additionally, a distance of displacement of the center C1 of the first sensors 161a, 161b to the inner side of the substrate S may vary in each sensor. Also, the center C1 of the imager may be displaced to the inner side only in any sensor. In another embodiment, in plan view, the center C1 of the imager of any or all of the first sensors 161 may correspond to the position of the corners of the substrate, or may be located at an outer side of the substrate than the position of the corners of the substrate. Additionally, while image-capturing positions of the first sensors 161 are adjacent to the corners where the alignment marks 73 are provided in an example shown in FIG. 16, this is not limited to such example. Also, while the image-capturing positions of the first sensors 161 and the second sensors 71 are different in the second embodiment, they may at least partially overlap.

In the second embodiment, the controller detects the positions of the sides and the inclination θa from image information of a periphery of the corners imaged by the first sensors 161 by image processing. Additionally, the controller may perform image processing of the entire imaging area by the first sensors 161 to detect the position of the sides and the inclination θa, or may perform image processing of a region adjacent to an assumed position of the sides (a region 161a1 in FIG. 16). Also, as one example, the controller calculates the intersection of the two adjacent sides as the position of the corner of the substrate S. By calculating the position of the corners as the intersection of the two adjacent sides, the position of the corners can be accurately calculated even when R exists at the corners or the position of the vertex is unclear. Moreover, the controller calculates the center position (xa0, ya0) of the substrate S based on the calculated position of the corners.

Figure 17:
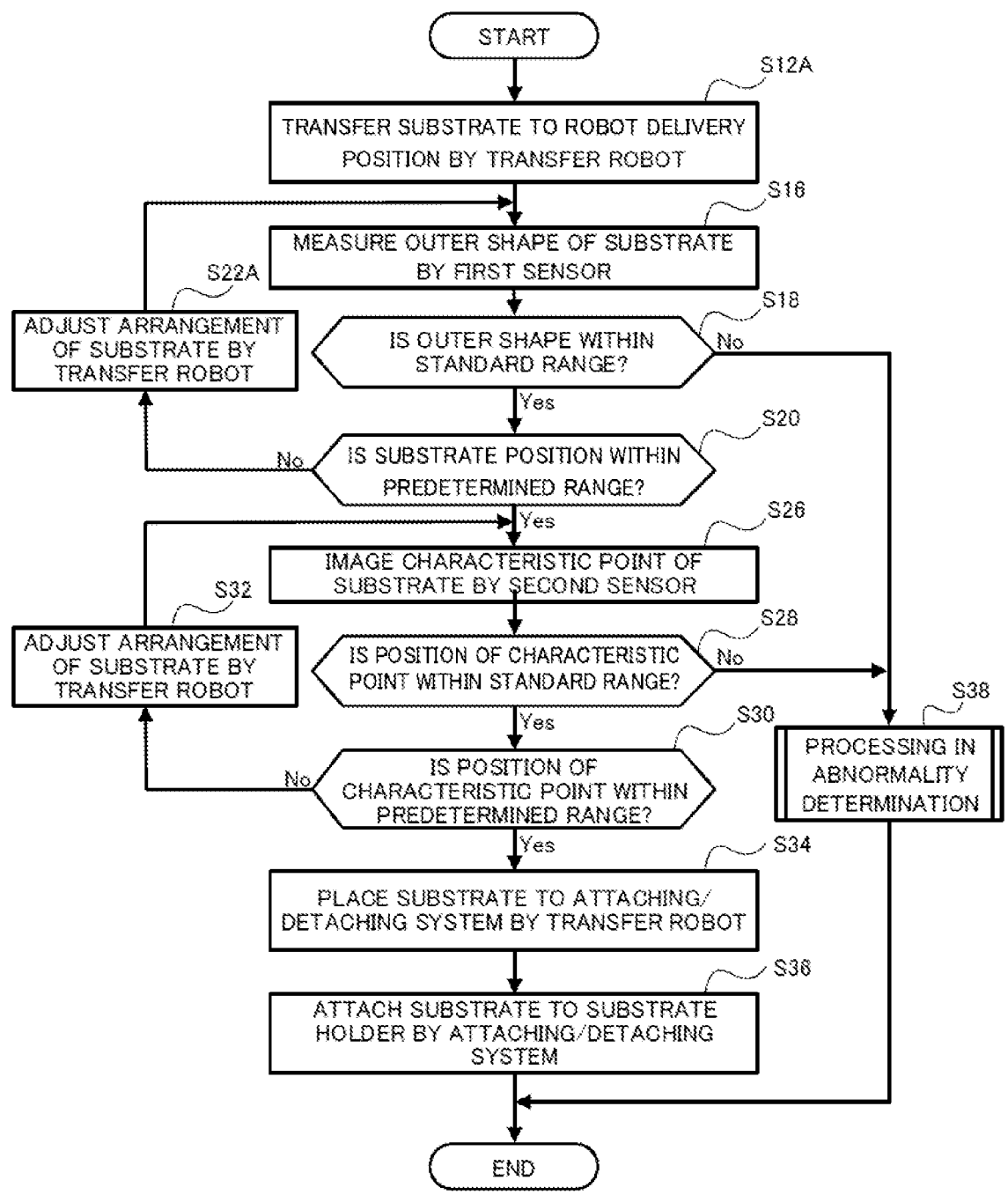
FIG. 17 is a flowchart showing one example of processing of the arrangement adjustment of the substrate in the second embodiment.

Next, the arrangement adjustment of the substrate S in the second embodiment will be explained with reference to a flowchart. FIG. 17 is a flowchart showing one example of processing of the arrangement adjustment of the substrate S in the second embodiment. In FIG. 17, the processing which is the same as that in the first embodiment shown in FIG. 14 is applied the same reference numeral. Hereinafter, an explanation is omitted for redundant processing explained in the first embodiment.

The processing shown in FIG. 17 is started when the substrate S is transferred to the attaching/detaching system 29 by the robot hand 272. First, the controller allows the transfer robot 270 to transfer the substrate S to a predetermined position of the attaching/detaching system 29 (step S12A). The transfer robot 270 is previously adjusted to transfer the substrate S to an assumed position (the first target setup position) in the attaching/detaching module 290. In step S12A, the substrate S is remained to be held by the hand of the transfer robot 270. Subsequently, the controller measures the outer shape of the substrate S by the first sensors 161 (step S16). Also, prior to the processing of step S16, the controller preferably moves the first illuminators (back light) 162 from the retracted position to the image-capturing position, and the corners of the substrate S are illuminated by the first illuminators 162. Subsequently, in the same manner as the first embodiment, the controller checks whether the outer shape of the substrate S is within the standard range (step S18), and when it is determined that the outer shape of the substrate S is out of the standard range, the controller performs the processing in abnormality determination (step S38). Also, when it is determined that the outer shape of the substrate S is within the standard range, the controller adjusts the position of the substrate S by the transfer robot 270 such that the position of the substrate S is within a predetermined range to the target setup position (the first target setup position) based on the calculated coordinate (xa0, ya0) using the first sensors 161 and the rotation angle θa (steps S20, S22A). Here, the first target setup position can be identical with the target setup position of the substrate S in the attaching/detaching system 29, that is, the second target setup position. Additionally, not limited to such example, the first target setup position may be different from the second target setup position. In this way, the outer shape of the substrate S is detected by the first sensors 161 and the arrangement of the substrate S is adjusted based on the detected result, thereby adjusting the arrangement of the substrate S with high accuracy.

When the arrangement of the substrate S is adjusted based on the detection by the first sensors 161, in the same manner as the first embodiment, the controller adjusts the arrangement of the substrate S based on the detection by the second sensors 71 (steps S26 to S32). This allows the substrate holder 11 to hold the substrate S at an appropriate portion by the pattern formed on the substrate S (step S36), and the subsequent processing can be performed in a more suitable manner. Additionally, the controller preferably moves the first illuminators 162 from the image-capturing position to the retracted position after the arrangement of the substrate S is adjusted based on the detection by the first sensors 161 or the arrangement of the substrate S is adjusted based on the detection by the second sensors 71.

Third Embodiment

Figure 18:
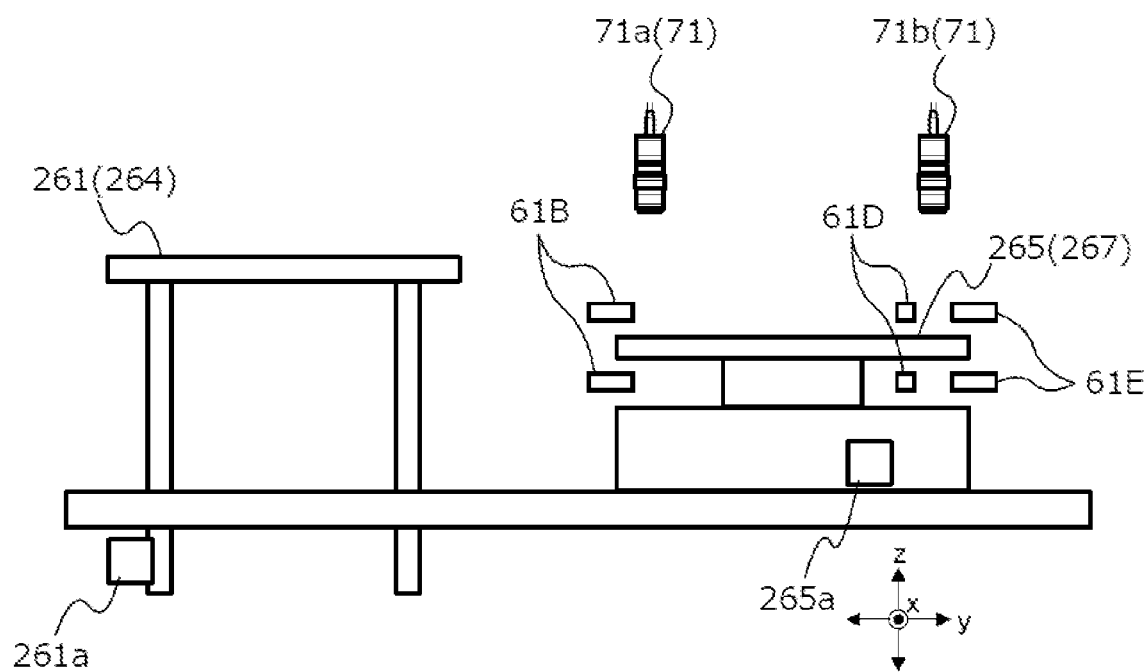
FIG. 18 is a schematic drawing for illustrating the arrangement adjustment of the substrate in the third embodiment.

FIG. 18 is a schematic drawing for illustrating arrangement adjustment of the substrate S in the third embodiment. In the substrate processing apparatus in the third embodiment, the first sensors 61 and the second sensors 71 are provided at the adjusting system 26. Additionally, while the second illuminators 72 are not shown in FIG. 18, the second illuminators 72 for the second sensors 71 may be provided at the adjusting system 26. In the third embodiment, in the same manner as the first embodiment, the controller adjusts the arrangement of the substrate S by the handling stage 265 based on the measurement of the outer shape of the substrate S by the first sensors 61. Moreover, the controller adjusts the arrangement of the substrate S by the handling stage 265 based on the detection of the characteristic point by the second sensors 71. Also in the third embodiment, subsequently the substrate S is placed on the attaching/detaching module 290 by the transfer robot 270, and accordingly, in the same manner as the first and second embodiments, the substrate holder 11 is allowed to hold the substrate S at an appropriate portion by the pattern formed on the substrate S. Additionally, in the third embodiment, the second sensors 71 may be provided only at the adjusting system for loading 26A, not the adjusting system for unloading 26B.

(Modification)

In the first to third embodiments, as one example of the substrate processing apparatus, a plating apparatus in which the substrate S is soaked into the plating liquid has been explained. However, the substrate processing apparatus is not limited to such plating apparatus, and for example, an apparatus which performs surface processing of the substrate by flowing processing liquid including plating liquid to the substrate may be used. Such apparatus may include a plurality of processors linearly arranged such as a water washing processor, a desmear processor and an electroless plating processor. Moreover, the substrate processing apparatus is not limited to the plating apparatus, and may be other apparatuses such as the arbitrary plating apparatus, the polishing apparatus, the grinding attachment, the coating equipment and the etching equipment.

Additionally, in the first to third embodiments, the alignment is finally performed based on the position of the characteristic point measured by the second sensors 71. Additionally, it is acceptable that the detection of the characteristic point by the second sensors 71 is used only for detection of misalignment of the pattern of the substrate S, and the alignment of the substrate S to the substrate holder is performed only based on the detection of the outer shape by the first sensors. Also in this case, without performing plating, the poor substrate can be excluded from the manufacturing line.

As described above, some embodiments according to the present invention have been explained. However, the embodiments of the present invention are for easy understanding of the present invention, and do not limit the present invention. The present invention can be modified and improved without departing from its gist, and needless to say, equivalents thereof may be included in the present invention. Moreover, any combination or omission of each constituent element described in the claims and the specification may be performed within a range where at least a part of the problem is resolved or a range where at least a part of effects is provided.

The present application is based upon and claims benefit of priority from Japanese Patent Application No. 2020-384 filed on Jan. 6, 2020. The entire contents including the specification, the claims, the drawings and the abstract of Japanese Patent Application No. 2020-384 are incorporated herein by reference as a whole. The entire contents including the specification, the claims, the drawings and the abstract of Japanese Patent Laid-Open No. 2018-168432 (PTL 1) are incorporated herein by reference as a whole.

The embodiments explained above can be also described as the following illustrative embodiments.

Illustrative Embodiment 1

According to illustrative embodiment 1, there is proposed a substrate processing apparatus including: a substrate holder which holds a substrate; an attaching/detaching system which attaches the substrate to the substrate holder; a first sensor which detects an arrangement of the substrate based on an outer shape of the substrate; a second sensor which detects a characteristic point formed in advance on a plate surface of the substrate; an adjusting system configured to adjust the arrangement of the substrate; and a controller, wherein the controller controls the adjusting system to adjust the arrangement of the substrate based on detection by the first sensor, the controller controls the second sensor to detect the characteristic point formed in advance on the plate surface of the substrate, wherein the arrangement of the substrate has been adjusted based on the detection by the first sensor, the controller checks whether a position of the characteristic point detected by the second sensor is within an allowable range, the controller controls the adjusting system to adjust the arrangement of the substrate based on detection by the second sensor when the position of the characteristic point detected by the second sensor is within the allowable range, and the controller controls the attaching/detaching system to attach the substrate to the substrate holder after the arrangement of the substrate is adjusted based on the detection by the second sensor.

According to illustrative embodiment 1, positioning of the substrate to the substrate holder can be performed with high accuracy for holding.

Illustrative Embodiment 2

According to illustrative embodiment 2, in illustrative embodiment 1, the controller allows the substrate to be transferred to a predetermined place which is different from the substrate holder when the position of the characteristic point detected by the second sensor is out of the allowable range. According to illustrative embodiment 2, the substrate in which the position of the characteristic point is out of the allowable range can be sorted.

Illustrative Embodiment 3

According to illustrative embodiment 3, in illustrative embodiment 1 or 2, the controller allows the substrate to be transferred to a predetermined place which is different from the substrate holder when a dimension of the substrate obtained by the detection by the first sensor is out of a predetermined standard range. According to illustrative embodiment 3, the substrate in which the dimension is out of the predetermined standard range can be sorted.

Illustrative Embodiment 4

According to illustrative embodiment 4, in illustrative embodiment 2 or 3, further including: a cassette which houses the substrate; and a substrate transporter which transfers the substrate housed in the cassette to the adjusting system, wherein the predetermined place is the cassette. According to illustrative embodiment 4, the substrate can be sorted to the cassette.

Illustrative Embodiment 5

According to illustrative embodiment 5, in illustrative embodiments 1 to 4, the adjusting system includes a first adjusting module which adjusts the arrangement of the substrate based on the detection by the first sensor and a second adjusting module which adjusts the arrangement of the substrate based on the detection by the second sensor.

Illustrative Embodiment 6

According to illustrative embodiment 6, in illustrative embodiment 5, the second adjusting module is a substrate transport equipment which holds and transfers the substrate between the first adjusting module and the attaching/detaching system.

Illustrative Embodiment 7

According to illustrative embodiment 7, in illustrative embodiments 1 to 5, the adjusting system includes a substrate transport equipment which holds and transfers the substrate.

Illustrative Embodiment 8

According to illustrative embodiment 8, in illustrative embodiment 6 or 7, the second sensor is provided to the attaching/detaching system, and the controller controls the second sensor to detect the characteristic point of the substrate held by the substrate transport equipment. According to illustrative embodiment 8, the arrangement of the substrate can be adjusted immediately before the substrate is attached to the substrate holder by the attaching/detaching system.

Illustrative Embodiment 9

According to illustrative embodiment 9, in illustrative embodiments 1 to 8, the adjusting system has a stage configured to be able to perform horizontal movement and/or rotational movement of the substrate mounted. According to illustrative embodiment 9, the arrangement of the substrate can be adjusted using the stage.

Illustrative Embodiment 10

According to illustrative embodiment 10, the first sensor is a laser sensor. As the laser sensor, especially, a sensor in which a plurality of laser-light emitter elements and a plurality of receiving elements are aligned on a line may be used.

Illustrative Embodiment 11

The substrate processing apparatus according to any one of illustrative embodiments 1 to 10, wherein the second sensor is an image sensor. As the image sensor, for example, a black and white camera and a color camera may be applied.

Illustrative Embodiment 12

According to illustrative embodiment 12, in illustrative embodiments 1 to 11, the controller notifies abnormality when the position of the characteristic point detected by the second sensor is out of the allowable range. According to illustrative embodiment 12, determination that the position of the characteristic point is out of the allowable range can be notified.

Illustrative Embodiment 13

According to illustrative embodiment 13, there is proposed a substrate processing method in a substrate processing apparatus including a substrate holder which holds a substrate, an attaching/detaching system which attaches the substrate to the substrate holder, and an adjusting system configured to adjust an arrangement of the substrate, the method including: a first detecting step of detecting the arrangement of the substrate based on an outer shape of the substrate; a first adjusting step of controlling the adjusting system to adjust the arrangement of the substrate based on detection in the first detecting step; a second detecting step of detecting a characteristic point formed in advance on a plate surface of the substrate, wherein the arrangement of the substrate has been adjusted in the first adjusting step; a second adjusting step of controlling the adjusting system to adjust the arrangement of the substrate based on detection in the second detecting step when a position of the characteristic point detected in the second detecting step is within an allowable range after checking whether the position of the characteristic point detected is within the allowable range; and an attaching step of controlling the attaching/detaching system to attach the substrate to the substrate holder after the second adjusting step.

According to illustrative embodiment 13, positioning of the substrate to the substrate holder can be performed with high accuracy for holding.

As described above, some embodiments according to the present invention have been explained. However, the embodiments of the present invention are for easy understanding of the present invention, and do not limit the present invention. The present invention can be modified and improved without departing from its gist, and needless to say, equivalents thereof may be included in the present invention. Moreover, any combination or omission of each constituent element described in the claims and the specification may be made within a range where at least a part of the problem is resolved or a range where at least a part of effects is provided.

REFERENCE SIGNS LIST 11 substrate holder
25 cassette table
25a cassette
26 adjusting system
261 temporary holder
265 handling stage (first adjusting module)
27 substrate transporter
270 transfer robot (second adjusting module)
270a controller
29 attaching/detaching system 290 attaching/detaching module
32 pre-wet module
33 pre-soak module
34 pre-rinse module
35 blow module
36 rinse module
37 substrate holder transporter
38 overflow bath
39 plating device
50 cleaning module
50a cleaner
61, 61A to 61E first sensors
62a light emitter
62b receiver
71, 71a, 71b second sensors
72, 72a, 72b second illuminators
100 substrate processing apparatus
110 load/unload station
120 processor
120A pre-processor/post-processor
120B plating processor
161, 161a, 161b first sensors
162, 162a, 162b first illuminators
175 controller
175A CPU
175B memory
175C control device
271 robot main body
272 robot hand

What is claimed is:

1. A substrate processing apparatus comprising:
a substrate holder which holds a substrate;
an attaching/detaching system which attaches the substrate to the substrate holder;
a first sensor which detects an arrangement of the substrate based on an outer shape of the substrate;
a second sensor which detects a characteristic point formed in advance on a plate surface of the substrate;
an adjusting system configured to adjust the arrangement of the substrate; and
a controller,
wherein the controller controls the adjusting system to adjust the arrangement of the substrate based on detection by the first sensor,
the controller controls the second sensor to detect the characteristic point formed in advance on the plate surface of the substrate, wherein the arrangement of the substrate has been adjusted based on the detection by the first sensor,
the controller checks whether a position of the characteristic point detected by the second sensor is within an allowable range,
the controller controls the adjusting system to adjust the arrangement of the substrate based on detection by the second sensor when the position of the characteristic point detected by the second sensor is within the allowable range, and
the controller controls the attaching/detaching system to attach the substrate to the substrate holder after the arrangement of the substrate is adjusted based on the detection by the second sensor,
wherein the adjusting system includes a first adjusting module which adjusts the arrangement of the substrate based on the detection by the first sensor and a second adjusting module which adjusts the arrangement of the substrate based on the detection by the second sensor,
wherein the second adjusting module is a substrate transport equipment which holds and transfers the substrate between the first adjusting module and the attaching/detaching system.

2. The substrate processing apparatus according to claim 1, wherein the controller allows the substrate to be transferred to a predetermined place which is different from the substrate holder when the position of the characteristic point detected by the second sensor is out of the allowable range.

3. The substrate processing apparatus according to claim 1, wherein the controller allows the substrate to be transferred to a predetermined place which is different from the substrate holder when a dimension of the substrate obtained by the detection by the first sensor is out of a predetermined standard range.

4. The substrate processing apparatus according to claim 2, further comprising:
a cassette which houses the substrate; and
a substrate transporter which transfers the substrate housed in the cassette to the adjusting system,
wherein the predetermined place is the cassette.

5. The substrate processing apparatus according to claim 1, wherein the adjusting system includes a substrate transport equipment which holds and transfers the substrate.

6. The substrate processing apparatus according to claim 1,
wherein the second sensor is provided to the attaching/detaching system, and
the controller controls the second sensor to detect the characteristic point of the substrate held by the substrate transport equipment.

7. The substrate processing apparatus according to claim 1, wherein the adjusting system has a stage configured to be able to perform horizontal movement and/or rotational movement of the substrate mounted.

8. The substrate processing apparatus according to claim 1, wherein the first sensor is a laser sensor.

9. The substrate processing apparatus according to claim 1, wherein the second sensor is an image sensor.

10. The substrate processing apparatus according to claim 1, wherein the controller notifies abnormality when the position of the characteristic point detected by the second sensor is out of the allowable range.

11. A substrate processing method in a substrate processing apparatus including a substrate holder which holds a substrate, an attaching/detaching system which attaches the substrate to the substrate holder, a first adjusting module configured to adjust an arrangement of the substrate, and a second adjusting module configured to hold and transfer the substrate between the first adjusting module and the attaching/detaching system, the method comprising:
a first detecting step of detecting the arrangement of the substrate based on an outer shape of the substrate;
a first adjusting step of controlling the first adjusting module to adjust the arrangement of the substrate based on detection in the first detecting step;
a second detecting step of detecting a characteristic point formed in advance on a plate surface of the substrate, wherein the arrangement of the substrate has been adjusted in the first adjusting step;
a second adjusting step of controlling the second adjusting module to adjust the arrangement of the substrate based on detection in the second detecting step when a position of the characteristic point detected in the second detecting step is within an allowable range after checking whether the position of the characteristic point detected is within the allowable range; and an attaching step of controlling the attaching/detaching system to attach the substrate to the substrate holder after the second adjusting step.

\* \* \* \* \*